US009741923B2

(12) United States Patent
Torok et al.

(10) Patent No.: US 9,741,923 B2
(45) Date of Patent: Aug. 22, 2017

(54) SPINRAM

(71) Applicant: Integrated MagnetoElectronics Corporation, Berkeley, CA (US)

(72) Inventors: E. James Torok, Shoreview, MN (US); Edward Wuori, Saint Paul, MN (US); Richard Spitzer, Berkeley, CA (US)

(73) Assignee: Integrated MagnetoElectronics Corporation, Berkeley, CA (US)

( * ) Notice: Subject to any disclaimer, the term of this patent is extended or adjusted under 35 U.S.C. 154(b) by 0 days.

(21) Appl. No.: 15/272,228

(22) Filed: Sep. 21, 2016

(65) Prior Publication Data
US 2017/0092843 A1    Mar. 30, 2017

Related U.S. Application Data

(60) Provisional application No. 62/232,977, filed on Sep. 25, 2015.

(51) Int. Cl.
| H01L 43/02 | (2006.01) |
| H01L 23/528 | (2006.01) |
| H01L 27/00 | (2006.01) |
| G11C 11/16 | (2006.01) |
| H01L 43/08 | (2006.01) |
| H01L 27/22 | (2006.01) |
| H01L 43/10 | (2006.01) |

(52) U.S. Cl.
CPC .......... H01L 43/02 (2013.01); G11C 11/161 (2013.01); H01L 23/528 (2013.01); H01L 27/222 (2013.01); H01L 43/08 (2013.01); H01L 43/10 (2013.01)

(58) Field of Classification Search
CPC ... H01L 23/528; H01L 23/481; H01L 23/147; H01L 27/222; H01L 27/226; H01L 27/115; H01L 27/112; H01L 43/02; H01L 43/10; H01L 43/08; H01L 45/085; H01L 45/1233; G11C 11/161; G11C 11/11; G11C 11/15; G11C 11/1675
See application file for complete search history.

(56) References Cited

U.S. PATENT DOCUMENTS

| 2,911,627 | A | | 11/1959 | Kilburn et al. |
| 3,493,943 | A | * | 2/1970 | Raffel ................ G11C 15/02 365/158 |
| 3,972,786 | A | | 8/1976 | Ballard |
| 4,751,677 | A | | 6/1988 | Daughton et al. |
| 4,780,848 | A | | 10/1988 | Daughton et al. |
| 4,829,476 | A | | 5/1989 | Dupuis et al. |

(Continued)

FOREIGN PATENT DOCUMENTS

| EP | 1 132 917 A2 | 3/2000 |
| WO | WO 87/00959 | 2/1987 |

(Continued)

OTHER PUBLICATIONS

GB Examination Report dated Februay 9, 2007 from GB0604381.4.

(Continued)

*Primary Examiner* — Nikolay Yushin
(74) *Attorney, Agent, or Firm* — Weaver Austin Villeneuve & Sampson LLP

(57) ABSTRACT

Magnetic random-access memory (RAM) cells and arrays are described based on magnetoresistive thin-film structures.

20 Claims, 14 Drawing Sheets

(56) References Cited

U.S. PATENT DOCUMENTS

| | | | |
|---|---|---|---|
| 4,980,859 A | 12/1990 | Guterman et al. |
| 5,051,695 A | 9/1991 | Hunter et al. |
| 5,173,873 A | 12/1992 | Wu et al. |
| 5,237,529 A | 8/1993 | Spitzer |
| 5,251,170 A | 10/1993 | Daughton et al. |
| 5,389,838 A | 2/1995 | Orengo |
| 5,432,734 A | 7/1995 | Kawano et al. |
| 5,442,508 A | 8/1995 | Smith |
| 5,477,143 A | 12/1995 | Wu |
| 5,477,482 A | 12/1995 | Prinz |
| 5,491,338 A | 2/1996 | Spitzer |
| 5,515,314 A | 5/1996 | Kouhei et al. |
| 5,561,368 A | 10/1996 | Dovek et al. |
| 5,563,839 A | 10/1996 | Herdt et al. |
| 5,565,236 A | 10/1996 | Gambino et al. |
| 5,585,986 A | 12/1996 | Parkin |
| 5,587,943 A | 12/1996 | Torok et al. |
| 5,592,413 A | 1/1997 | Spitzer |
| 5,640,343 A | 6/1997 | Gallagher et al. |
| 5,640,754 A | 6/1997 | Lazzari et al. |
| 5,650,889 A | 7/1997 | Yamamoto et al. |
| 5,650,958 A | 7/1997 | Gallagher et al. |
| 5,652,445 A | 7/1997 | Johnson |
| 5,654,566 A | 8/1997 | Johnson |
| 5,661,449 A | 8/1997 | Araki et al. |
| 5,682,345 A | 10/1997 | Roohparvar et al. |
| 5,686,837 A | 11/1997 | Coehoorn et al. |
| 5,793,697 A | 8/1998 | Scheuerlein |
| 5,852,574 A | 12/1998 | Naji |
| 5,892,708 A | 4/1999 | Pohm |
| 5,903,708 A | 5/1999 | Kano et al. |
| 5,920,500 A | 7/1999 | Tehrani et al. |
| 5,929,636 A | 7/1999 | Spitzer et al. |
| 5,969,978 A | 10/1999 | Prinz |
| 5,986,962 A | 11/1999 | Bertin et al. |
| 5,989,406 A | 11/1999 | Beetz et al. |
| 6,031,273 A | 2/2000 | Torok et al. |
| 6,034,886 A | 3/2000 | Chan et al. |
| 6,055,179 A | 4/2000 | Koganei et al. |
| 6,104,632 A | 8/2000 | Nishimura |
| 6,129,957 A | 10/2000 | Xiao et al. |
| 6,134,138 A | 10/2000 | Lu et al. |
| 6,166,944 A | 12/2000 | Ogino |
| 6,169,292 B1 | 1/2001 | Yamazaki et al. |
| 6,278,594 B1 | 8/2001 | Engel et al. |
| 6,292,336 B1 | 9/2001 | Horng et al. |
| 6,353,552 B2 | 3/2002 | Sample et al. |
| 6,469,927 B2 | 10/2002 | Spitzer et al. |
| 6,483,740 B1 | 11/2002 | Spitzer et al. |
| 6,493,257 B1 | 12/2002 | Coughlin, Jr. et al. |
| 6,538,437 B2 | 3/2003 | Spitzer et al. |
| 6,542,000 B1 | 4/2003 | Black et al. |
| 6,573,713 B2 | 6/2003 | Torok et al. |
| 6,594,175 B2 | 7/2003 | Torok et al. |
| 6,738,284 B2 | 5/2004 | Torok et al. |
| 6,859,063 B2 | 2/2005 | Nuspl et al. |
| 6,865,109 B2 | 3/2005 | Covington |
| 6,992,919 B2 | 1/2006 | Andrei et al. |
| 6,992,935 B2 | 1/2006 | Ooishi |
| 7,005,852 B2 | 2/2006 | Andrei et al. |
| 7,220,968 B2 | 5/2007 | Burger et al. |
| 7,224,566 B2 | 5/2007 | Barna et al. |
| 7,911,830 B2 * | 3/2011 | Torok ...................... G11C 11/15 365/158 |
| 8,300,455 B2 * | 10/2012 | Torok ...................... G11C 11/15 365/158 |
| 8,619,467 B2 | 12/2013 | Torok et al. |
| 2002/0005717 A1 | 1/2002 | Spitzer et al. |
| 2002/0009840 A1 | 1/2002 | Torok et al. |
| 2002/0024842 A1 | 2/2002 | Spitzer et al. |
| 2002/0029462 A1 | 3/2002 | Spitzer et al. |
| 2002/0037595 A1 | 3/2002 | Hostani |
| 2002/0154455 A1 | 10/2002 | Lenssen |
| 2002/0180431 A1 | 12/2002 | Torok et al. |
| 2002/0180432 A1 | 12/2002 | Spitzer et al. |
| 2003/0214835 A1 | 11/2003 | Nejad et al. |
| 2003/0231077 A1 | 12/2003 | Nuspl et al. |
| 2004/0010671 A1 | 1/2004 | Sampsa et al. |
| 2004/0037109 A1 | 2/2004 | Witcraft et al. |
| 2004/0061166 A1 | 4/2004 | Kim |
| 2004/0075152 A1 | 4/2004 | Barna et al. |
| 2004/0136231 A1 | 7/2004 | Huai et al. |
| 2004/0183198 A1 | 9/2004 | Andrei et al. |
| 2004/0196704 A1 | 10/2004 | Andrei et al. |
| 2005/0018476 A1 | 1/2005 | Kamijima et al. |
| 2005/0083743 A1 | 4/2005 | Andrei et al. |
| 2005/0248888 A1 | 11/2005 | Dieny et al. |
| 2005/0269612 A1 | 12/2005 | Torok et al. |
| 2006/0186342 A1 | 8/2006 | Burger et al. |
| 2008/0285331 A1 | 11/2008 | Torok et al. |
| 2009/0244957 A1 | 10/2009 | Clinton et al. |
| 2011/0211387 A1 | 9/2011 | Torok et al. |
| 2011/0211388 A1 | 9/2011 | Torok et al. |

FOREIGN PATENT DOCUMENTS

| | | |
|---|---|---|
| WO | WO 96/25740 | 8/1996 |
| WO | WO 97/41601 | 10/1997 |
| WO | WO 00/72324 | 11/2000 |
| WO | WO 02/05268 A2 | 1/2002 |
| WO | WO 02/05470 A2 | 1/2002 |
| WO | WO 02/078100 A1 | 10/2002 |

OTHER PUBLICATIONS

GB Examination Report dated May 8, 2007 from GB0604381.4.
GB Examination Report dated Sep. 8, 2006 from GB0604381.4.
International Search Report dated May 5, 2011, Application No. PCT/US11/25448.
Notification Concerning Transmittal of International Preliminary Report on Patentability dated Mar. 23, 2006 for PCT/US2004/029317.
Notification Concerning Transmittal of International Preliminary Report on Patentability dated Oct. 16, 2008 for PCT/US2004/009418.
Notification of Transmittal of the International Search Report and the Written Opinion of the International Searching Authority dated Feb. 22, 2005 for PCT/US2004/029317.
Notification of Transmittal of the International Search Report and the Written Opinion of the International Searching Authority dated Oct. 15, 2008 for PCT/US2008/063781.
Notification of Transmittal of the International Search Report and the Written Opinion of the Interntional Searching Authority dated May 28, 2008 for PCT/US04/09418.
Notification of Transmittal of the International Search Report dated Jul. 1, 2004 for PCT/US03/39262.
International Search Report dated Dec. 8, 2016, Application No. PCT/US16/053046.
Albon, C., "Integration of tunneling magnetoresistive sensors for high resolutive magnetic particle detection", PhD Thesis in Physics, Department of Physics, Bielefeld University (Nov. 2009), 128 pages.
Awschalom et al., "Spintronics", Scientific American, www.sciam.com, Jun. 2002.
Barna et al., "The Transpinnor: An Active Spin-Based Device" Non-Volatile Memory Technology Symposium 2002, Nov. 4-6, 2002.
Buschow, K.H.J., "Handbook of Magnetic Materials", vol. 17, Elsevier Science (Dec. 2007), 596 pages.
C. H. Marrows, et al. "Finite size scaling effects in giant magnetoresistance multilayers", vol. 18, 2006, pp. 243-252.
C. H. Marrows, et al., J. Phys: Condens, "Giant Magnetoresistance and Oscillatory Exchange Coupling in Disordered Co/Cu multilayers", vol. 11, 1999, pp. 81-88.
C. H. Marrows, et al., Physical Review B., Impurity Scattering from δ-layers in giant magnetoresistance systems, vol. 63, 220405-1 to 220405-.
Callaby, D.R. et al., Solid State Memory Study Final Report, Technical Report No. RE-0013, National Media Lab, St. Paul, MN (Feb. 1994).

(56) References Cited

OTHER PUBLICATIONS

Dieny, et al., "Spin-transfer effect anditsuse in spintronic components", Int. J. Nanotechnol, vol. 7, Nos. 4/5/6/7/8, 2010, pp. 591-613.

G. Zorpette, IEEE Spectrum, "The Quest for the Spin Transistor", vol. 38, Dec. 2001, pp. 30-35.

Gallagher, W.J. et al., "Development of the magnet tunnel junction MRAM at IBM: From first junctions to a 16-Mb MRAM demonstrator chip", IBM J. Res. & Dev. vol. 50—No. 1 (Jan. 2006), 20 pages.

Gallagher, W.J. et al., "High-Speed 128Kbit MRAM Core in a 0.18μm CMOS Technology Utilizing PtMn-based Magnetic Tunnel Junctions", Non-Volatile Memory Technology Symposium, NVMTS (Nov. 2003), 27 pages.

Grünberg, "Layered Magnetic Structures: History, Highlights, Applications", *Physics Today*, May 2001.

H. Kano, et al., Appl. Phys. Lett., "Substrate temperature effect on giant magnetoresistanc eof sputtered Co/Cu multilayers", vol. 63, No. 20, Nov. 15, 1993, pp. 2839-2841.

H.W. Schumacher et al., "*Current-induced precessional magnetization reversal*", Applied Physics Letters, vol. 83, No. 11, pp. 2205-2207, Sep. 15, 2003.

Harrison, R.W., "*Laser Scanning Surface Profilomete*", IBM Technical Disclosure Bullentin, 13(3): 789-790 (Aug. 1970).

Hylton, T.L., et al, "Giant Magnetoresistance at Low Fields in Discontinuous NiFe—Ag Multilayer Thin Films", *Science*, 261:1021-1024 (Aug. 1993).

J. Colino, et al., Physical Review B, "Connection between giant magnetoresistance and structure in molecular-beam epitaxy and sputtered Fe/Cr superlattices", vol. 53, No. 2, Jan. 1, 1996, pp. 766-769.

J. Mathon, et al., "Physical Review B," Theory of tunneling magnetoresistance of an epitaxial Fe/MgO/Fe(001) junction, vol. 63, 220403(R), 2001, pp. 220403-1-220403-4.

J.L. Brown, "1-Mb Memory Chip Using Giant Magnetoresistive Memory Cells," Sep. 1994, *IEEE Transactions on Components, Packaging, and Manufacturing Technology*, Part A, vol. 17, No. 3, pp. 373-379.

J.M. Daughton, "Magnetoresistive Memory Technology," Jul. 28-Aug. 2, 1991, *Int'l Workshop on Science and Technology of Thin Films for the 21st Century*, vol. 216, pp. 162-168.

Jaquelin K. Spong, et al., "Giant Magnetoresistive Spin Valve Bridge Sensor", Mar. 1996, *IEEE Transactions on Magnetics*, vol. 32, No. 2, pp. 366-371.

Jones, K., "Texas Instruments Plans Large Expansion", *The New York Times* (Aug. 20, 1993).

K.-M.H. Lenssen, "Expectations of MRAM in Comparison with Other Non-Volatile Memory Technologies", Non-Volatile Memory Technology Symposium 2000, Nov. 15-16, 2000.

K.-M.H. Lenssen, "Magnetic Random Access Memory (MRAM) and its prospects", Non-Volatile Memory Technology Symposium 2001, Nov. 7-8, 2001.

K.T.M. Ranmuthu et al., "New Low Current Memory Modes with Giant Magneto-Resistance Materials," Apr. 13, 1993, *Digests of International Magnetics Conference*, 2 pages.

Kabos et al., "*Metastable States in Large Angle Magnetization Rotations*", IEEE Transactions of Magnetics, vol. 36, No. 5, pp. 3050-3052, Sep. 2000.

Katti et al., *IEEE Circuits and Devices*, Mar. 2001, pp. 26-34.

Klostermann, U.K. et al., "Influence of a magnetic seed line on the switching behaviour of submicrometre sized magnetic tunnel junctions", published online at stacks.iop.org/JPhysD/34/2117 (Jul. 2001), pp. 2117-2122.

L. Jiang, et al., Applied Physics Express, vol. 2, 083002, pp. 083002-1-083002-3.

Mark Johnson, "Bipolar Spin Switch", Apr. 16, 1996, *Science*, vol. 260, pp. 320-323.

Mark Johnson, "The All-Metal Spin Transistor", May 1994, *IEEE Spectrum*, pp. 47-51.

National Media Laboratory Spring Review on Solid-State Memory Technologies, Proc. 1994 Spring Conference on Solid-State Memory Technologies, Pasadena, CA, (May 23-25, 1994), pp. 3-8, 97, 121, 123-133.

Parkin, S., "Spin-Polarized Current in Spin Valves and Magnetic Tunnel Junctions", Abstract, MRS Bulletin, vol. 31 (May 2006), pp. 389-394.

Parkin, S.S.P, et al., "Oscillatory Magnetic Exchange Coupling through Thin Copper Layers", *Physical Review Letters*, 66(16): 2152-2155 (Apr. 1991).

Paul a. Packan, "*Pushing the Limits*", Sep. 24, 1999. science Mag, vol. 285, pp. 2079-2081.

Pratt, W.P., et al., "Perpendicular Giant Magnetoresistances of Ag/Co Multilayers", *Physical Review Letters*, 66 (23): 3060-3063 (Jun. 1991).

Prejbeanu, et al., "Thermally assisted MRAM", J. Phys.: Condens Matter, 2007, pp. 1-26.

Prinz, "Magnetoelectronics", www.sciencemag.org, Science, vol. 282, Nov. 27, 1998.

R. J. Celotta, et al., Journal of Magnetism and Magnetic Materials, Oscillatory magnetic coupling in Fe/Ag/Fe(100) sandwich structures 127:205-213 (1993).

Richter, R., "Logic gates realized with spin dependent tunneling elements", Dissertation; Department of Physics, Bielefeld University (Sep. 2002), 125 pages.

Russek et al., "*Time and Frequency Domain Measurements of Ferromagnetic Resonance in Small-Spin Valve*", IEEE Transactions on Magnetics, vol. 36, No. 5, pp. 2560-2562, Sep. 2000.

S. A. Wolf, "Spintronics: A Spin-Based Electronics Vision for the Future", www.sciencemag.org, Science, vol. 294, Nov. 16, 2001.

S. Chikazumi, *Physics of Magnetism*, Section 5.3, entitled "Ferrimagnetic Oxides and Compounds," John Wiley & Sons (1964).

S. Das Sarma, American Scientist, "Spintronic", vol. 89, 2001, 516.

S. Ikeda, et al., Applied Physics Letters, "Tunnel magnetoresistance of 604% at 300 K by suppression of Ta diffusion in CoFeB/MgO/CoFeB pseudo-spin-valves annealed at high temperature", vol. 93, 082508, 2008, 4 pp.

S. M. Bedair, et al., "Spintronic Memories to Revolutionize Data Storage", IEEE Spectrum, Nov. 2010, pp. 1-5.

S. S. Parkin, et al., "Giant tunneling magnetoresistance at room temperature with MgO (100) tunnel barriers", Nature Materials, vol. 3, Dec. 2004, pp. 862-867.

S. S. Parkin, Appl. Phys. Lett., "Giant magnetoresistance in antiferromagnetic Co/Cu multilayers", vol. 58, No. 23, Jun. 10, 1991, pp. 2710-2712.

S. S. Parkin, Physical Review Letters, "Origin of Enhanced Magnetoresistance of Magnetic Multilayers: Spin-Dependent Scattering from Magnetic Interface States", vol. 71, No. 10, Sep. 6, 1993, pp. 1641-1644.

S. Yuasa, et al., Nature Materials, "Giant Room-temperature magnetoresistance in single-crystal Fe/MgO/Fe magnetic tunnel junctions", vol. 3, Dec. 2004, pp. 868-871.

Schmalhorst, J. et al, "Switching stability of magnetic tunnel junctions with an artificial antiferromagnet", J Appl. Phys. vol. 77, No. 21 (Nov. 2000), pp. 3456.

Schmalhorst, J. et al, "Temperature stability of Co/AI2O3/Co junctions", J Appl. Phys. vol. 87, No. 9 (May 2000), pp. 5191.

Sousa, et al., "Non-volatile magnetic random access memories (MRAM)", Physics, Oct. 25, 2005, preprint submitted to Elsevier Science, 10 pages.

Spitzer and Torok, "A New Kind of Memory", *The Industrial Physicist*, Jun. 2000.

Spitzer and Wuoi, Demagnetizing Fields in Magnetic RAM, Dec. 2008, Integrated Magneto-Electronics Dec. 2008.

T. Choy, "Electron Transport Theory in Magnetic Nanostructures", A Disseration presented to the Graduate School of the University of Florida, 2001.

T. Shinjo and H. Yamamoto, Journal of the Physical Society of Japan, "Large Magnetoresistance of Field-Induced Giant Ferrimagnetic Multilayers", vol. 59, No. 9, Sep. 1990, pp. 3061-3064.

Torok et al., "Measurement of the Easy-Axis and Hk Probability Density Functions for Thin Ferromagnetic Films Using the Longi-

(56) References Cited

OTHER PUBLICATIONS tudinal Permeability Hysteresis Loop", *Journal of Applied Physics*, 33, No. 10, Oct. 1962, pp. 3037-3041.

Torok, et al, "Longitudinal Permeability in Thin Permalloy Films", *Journal of Applied Physics*, 34, No. 4, (Part 2), Apr. 1963, pp. 1064-1066.

W. H. Butler, et al., Physical Review B, "Spin-dependent tunning conductance of Fe/MgO/Fe sandwiches", vol. 63,054416, 2001, pp. 054416-1-.

Wang et al., *Fabrication and properties of spin dependent tunneling junctions with CoFeHfO as free layers*, Journal of Applied Physics, vol. 89, No. 11, Jun. 1, 2001.

X. Zhu et al., "A Novel Vertical MRAM Design".

Xiao, et al., "Giant Magnetoresistance in Nonmultilayer Magnetic Systems", *Physical Review Letters*, vol. 68, No. 25, 22 Jun. 1992, pp. 3749-3752.

Zhang, S., "Theory of Giant Magnetoresistance in Magnetic Granular Films",*Appl. Phys. Lett.*, 61(15): 1855-1857 (Oct. 1992).

Zhu, J. et al, "Ultrahigh density vertical magnetoresistive random access memory (invited)", J Appl. Phys. vol. 87, No. 9 (May 2000), pp. 6668.

\* cited by examiner

| Figure | Key parameters | Width | GMR observed | Switching field (sf) |
|---|---|---|---|---|
| 9 | EAM ↕ H Unpaired | 600 nm | No | 10 x bulk sf |
| 10 | EAM ↕ H Unpaired | 140 nm | No | 100 x bulk sf |
| 11 | EAM ↕ H Paired | 600 nm | No | 150 x bulk sf |
| 12 | EAM ↕ H Paired | 140 nm | Yes | 2 x bulk sf |

Table 1

*FIG. 15*

SPINRAM

RELATED APPLICATION DATA

The present application claims priority under 35 U.S.C. 119(e) to U.S. Provisional Patent Application No. 62/232,977 entitled SpinRAM filed on Sep. 25, 2015, the entire disclosure of which is incorporated herein by reference for all purposes.

BACKGROUND

In order to realize the full potential of magnetic random access memory (RAM), whether based on tunnel magnetoresistance (TMR) or giant magnetoresistance (GMR), fundamental challenges at the basic cell design need to be addressed. Such challenges include (1) scalability (e.g., decreasing drive currents and stable error rates with decreasing feature size); (2) endurance (e.g., the number of read/write cycles before cell breakdown); and (3) thermal stability of stored information (e.g., stability against errors due to thermally-induced transitions between two states that represent different bit values, an effect that increases with decreasing element volume and comes into play at deep nanoscale feature sizes).

Cell design features that we have conceived to enable scalability, increased endurance, and thermal stability include (1) a closed-flux cell structure, (2) parallel drive lines at the memory cell, and (3) increased film thickness. Each of these design features is described in more detail below.

An issue that transcends the individual cell design is the compatibility of magnetic RAM fabrication technology with CMOS processing. Some success with regard to this issue has already been demonstrated by commercial magnetic RAM. Another higher level issue is capacity (e.g., sufficient write and read margins for large arrays). We found that the issues attendant to scalability and capacity can be treated as distinct.

The issue of thermal stability has been resolved conceptually. See, for example, U.S. Pat. No. 7,911,830 entitled Scalable Nonvolatile Memory issued Mar. 22, 2011, the entire disclosure of which is incorporated herein by reference for all purposes.

We determined that a critical factor for scalability is control of the demagnetizing field $H_d$, i.e., the field produced by the magnetization M according to: $\nabla \cdot H_d = -4\pi \nabla \cdot M$. The presence of $H_d$ in a magnetic RAM (e.g., due to incomplete flux closure in its memory cells) causes multiple problems. Inside the memory cell the write current needs to overcome $H_d$ to impress a given magnetization on the material, i.e., the write current must increase to write the bit value. Additionally, $H_d$ from one cell can disturb the magnetization (i.e., change the bit values) of neighboring cells, causing errors. Increasing cell footprint can mitigate increase in error rates, but this sacrifices cell density. $H_d$ also causes "shearing," a decrease in the slope of the intrinsic hysteresis loop of a cell, that produces skewed minor loop operation and a resulting decrease in the signal strength of the cell's read signal. Moreover, in a cell without fully-closed flux, $H_d$ increases strongly as feature size decreases into nanoscale.

These problems—increasing drive currents, increasing error rates, increasing cell footprint, and decreasing signal strength—are exacerbated by increasing demagnetizing fields that accompany decreasing feature size. These problems are further exacerbated by the interplay between thermal fluctuations and $H_d$ in that the two can reinforce each other in specific configurations. To address these problems, we designed a memory cell that has a fully closed-flux and which is characterized by decisive advantages in power consumption, error rates, and memory density over designs with incomplete flux closure.

We also developed a measurement protocol to separate out the effects of demagnetizing fields from possible thermal effects in a magnetic RAM (based on either GMR or TMR) and to determine the magnitude of both. See R. Spitzer and E. Wuori, *Demagnetizing Fields in Magnetic RAM*, Intermag 2009, Session ET-06, the entire disclosure of which is incorporated herein by reference for all purposes.

Capacity is linked to the signal strength provided by the film (GMR or TMR) used in the memory cell. We chose GMR films for our cell design, despite the smaller signal of presently available GMR structures than that of TMR, for three reasons: (i) simplicity of cell design—the GMR cell size is about one-half that of the TMR cell size, and requires fewer than one-half the number of masking steps; (ii) the method for addressing thermal stability at deep nanoscale lends itself much more readily to GMR than to TMR structures; (iii) the functional memory components of our magnetic RAM—the memory array without support electronics—may be constructed with metals and insulators alone (no semiconductors). This provides the potential for monolithic 3D structures (vertically replicated 2D arrays). The storage density of such a 3D SpinRAM with 4 levels of 2D arrays can exceed that of a hard disk at 30 nm feature size and, for many mainstream applications (e.g., ones that depend on a specific number of input/output operations per second) it will likely be strongly economically competitive with hard disks. Additional information and examples are provided in U.S. Pat. No. 6,992,919 entitled All-Metal Three-Dimensional Circuits and Memories issued Jan. 31, 2006, the entire disclosure of which is incorporated herein by reference for all purposes.

To realize the strong sense signal needed for high capacity, we developed a ferromagnetically-coupled GMR superlattice with low drive fields and potential for significantly higher useful GMR values than currently available, well upwards of 50%. Examples of such a superlattice structure are described in U.S. Pat. No. 8,619,467 entitled High GMR Structure With Low Drive Fields issued Dec. 31, 2013, the entire disclosure of which is incorporated herein by reference for all purposes.

The issue of cell endurance is addressed by our crosspoint magnetic RAM with a coincident-current architecture and tied to the configuration of the drive lines in the memory array as described, for example, in U.S. Pat. No. 7,911,830 incorporated herein by reference above.

Despite these successes in the advancement of magnetic RAM design, further improvement continues to be our goal.

SUMMARY

According to a particular class of implementations, a memory includes a plurality of first signal lines, a plurality of second signal lines, and a plurality of first thin-film structures exhibiting magnetoresistance. The first signal lines, the second signal lines, and the first thin-film structures form an array of memory cells. Each memory cell includes (i) a portion of a corresponding one of the first thin-film structures; (ii) a portion of a corresponding one of the first signal lines coinciding with the portion of the corresponding first thin-film structure and electrically isolated therefrom; (iii) a portion of a corresponding one of the second signal lines coinciding with the portion of the corresponding first signal line and the portion of the corresponding first thin-film structure, the portion of the corresponding second signal line being electrically isolated from the corresponding first signal line and the corresponding first thin-film structure; and (iv) one or more keeper elements in direct contact with the portion of the corresponding first thin-film structure such that the portion of the corresponding first thin-film structure and the one or more keeper elements form at least part of a fully-closed-flux structure of the memory cell. For each memory cell, the portion of the corresponding first thin-film structure has an easy axis of magnetization perpendicular to a longitudinal axis of the portion of the corresponding first thin-film structure. The first and second signal lines are configured to generate magnetizing fields at each memory cell that are perpendicular to the longitudinal axis of the portion of the corresponding first thin-film structure.

According to a specific implementation, the memory includes a plurality of second thin-film structures exhibiting magnetoresistance, and each memory cell includes a portion of a corresponding one of the second thin-film structures. The portion of the corresponding second thin-film structure for each memory cell coincides with and is electrically isolated from the corresponding first signal line, the corresponding second signal line, and the corresponding first thin-film structure. For each memory cell, the portion of the corresponding second thin-film structure forms part of the fully-closed flux structure.

According to a specific implementation, the first and second signal lines are configured such that, for each memory cell, a primary direction of current flow in the portion of the corresponding first signal line is parallel to a primary direction of current flow in the portion of the corresponding second signal line.

According to a specific implementation, at each memory cell, the portion of the corresponding first thin-film structure and the portions of the corresponding first and second signals lines are co-linear. According to a more specific implementation, each of the first thin-film structures includes sections of non-magnetic conductors between adjacent memory cells.

According to a specific implementation, the first thin-film structure includes at least one high-coercivity magnetic layer and at least one low-coercivity magnetic layer. According to a more specific implementation, the first thin-film structure includes a pair of low-coercivity magnetic layers. According to another more specific implementation, the first thin-film structure comprises a ferromagnetically-coupled superlattice having multiple periods of the high and low-coercivity layers.

According to a specific implementation, each memory cell is characterized by an aspect ratio of approximately 1 to 1.2.

According to another class of implementations, a memory cell includes (i) a portion of a first thin-film structure; (ii) a first signal line coinciding with the portion of the first thin-film structure and electrically isolated therefrom; (iii) a second signal line coinciding with the first signal line and the portion of the first thin-film structure, the second signal line being electrically isolated from the first signal line and the first thin-film structure; and (iv) one or more keeper elements in direct contact with the portion of the first thin-film structure such that the portion of the first thin-film structure and the one or more keeper elements form at least part of a fully-closed-flux structure of the memory cell. The portion of the first thin-film structure has an easy axis of magnetization perpendicular to a longitudinal axis of the first thin-film structure. The first and second signal lines are configured to generate magnetizing fields that are perpendicular to the longitudinal axis of the first thin-film structure.

According to a specific implementation, the memory cell includes a portion of a second thin-film structure coinciding with and electrically isolated from the first signal line, the second signal line, and the first thin-film structure. the portion of the second thin-film structure forms part of the fully-closed flux structure.

According to a specific implementation, the first and second signal lines are configured such that a primary direction of current flow in the first signal line at the memory cells is parallel to a primary direction of current flow in the second signal line at the memory cell.

According to a specific implementation, the portion of the first thin-film structure and the first and second signals lines are co-linear at the memory cell. According to a more specific implementation, the first thin-film structure includes sections of non-magnetic conductors on either side of the memory cell.

According to a specific implementation, the portion of the first thin-film structure includes at least one high-coercivity magnetic layer and at least one low-coercivity magnetic layer. According to a more specific implementation, the portion of the first thin-film structure includes a pair of low-coercivity magnetic layers. According to another more specific implementation, the portion of the first thin-film structure comprises a ferromagnetically-coupled superlattice having multiple periods of the high and low-coercivity layers.

According to another class of implementations, a memory cell includes (i) a portion of a first thin-film structure exhibiting giant magnetoresistance, the first thin film structure including a high-coercivity magnetic layer and a corresponding pair of low-coercivity magnetic layers; (ii) a first signal line coinciding with the portion of the first thin-film structure and electrically isolated therefrom; (iii) a second signal line coinciding with the first signal line and the portion of the first thin-film structure, the second signal line being electrically isolated from the first signal line and the first thin-film structure; (iv) a portion of a second thin-film structure coinciding with and electrically isolated from the first signal line, the second signal line, and the first thin-film structure, the second thin-film structure exhibiting giant magnetoresistance and including a high-coercivity magnetic layer and a corresponding pair of low-coercivity magnetic layers; and (v) one or more keeper elements in direct contact with the portion of the first thin-film structure and the portion of the second thin-film structure such that the portion of the first thin-film structure, the portion of the second thin-film structure, and the one or more keeper elements form a fully-closed-flux structure of the memory cell. The portion of the first thin-film structure has an easy axis of magnetization perpendicular to a longitudinal axis of the first thin-film structure. The portion of the second thin-film structure has an easy axis of magnetization perpendicular to a longitudinal axis of the second thin-film structure. The first and second signal lines are configured to generate magnetizing fields that are perpendicular to the longitudinal axes of both the first and second thin-film structures.

A further understanding of the nature and advantages of various implementations may be realized by reference to the remaining portions of the specification and the drawings.

BRIEF DESCRIPTION OF THE DRAWINGS

FIG. 15 includes Table 1 which provides a summary of results for GMR-film and drive-line characteristics in FIGS. 9-12, with no keepers.

DETAILED DESCRIPTION

Figure 1:
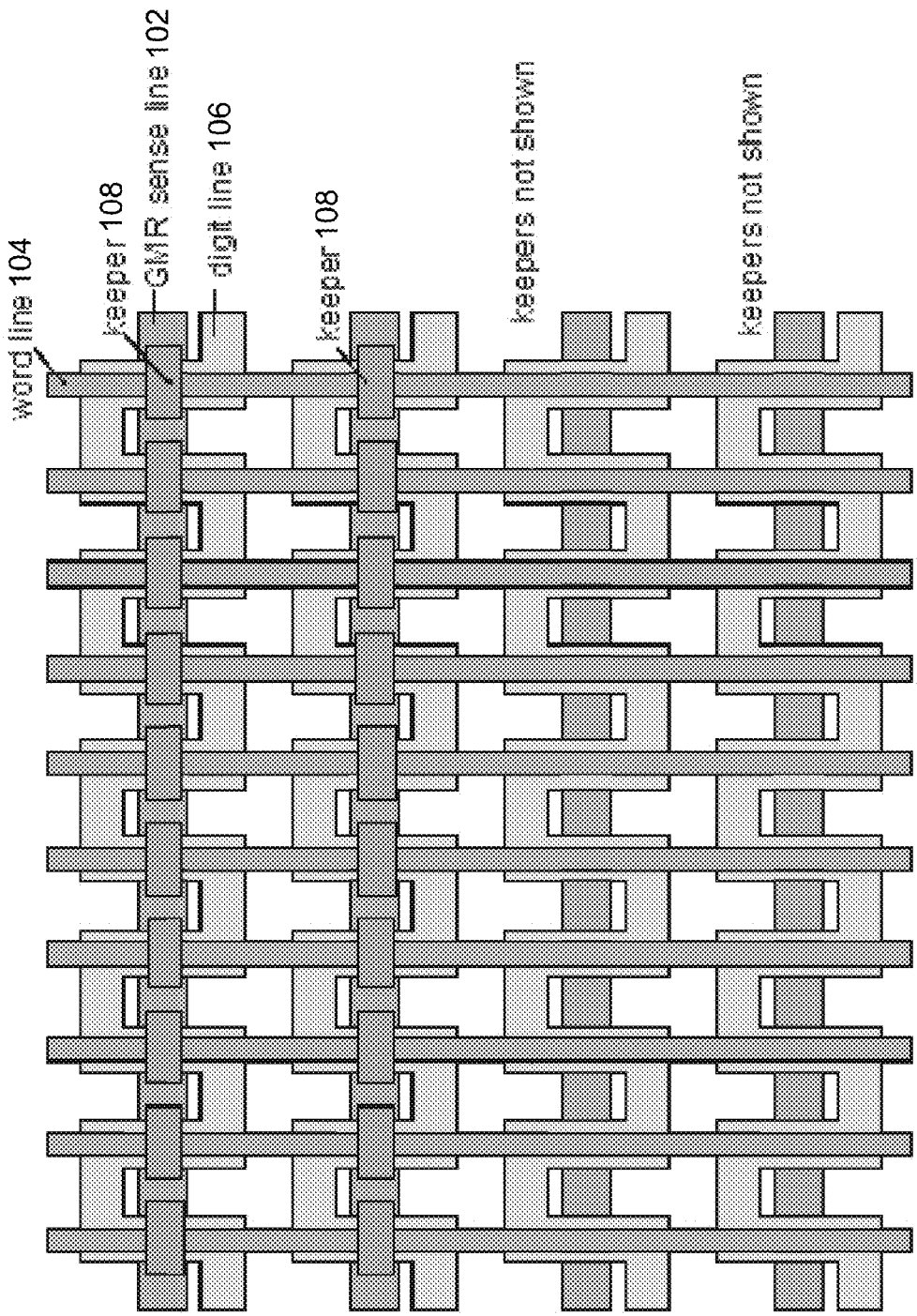
FIG. 1 shows a simplified representation of the layout of a SpinRAM array.

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

The present application describes various implementations of memory cells and memory architectures collectively referred to as SpinRAM. As will be discussed, particular implementations are projected to enable SpinRAM arrays with feature sizes decreasing into deep nanoscale.

According to a particular class of implementations, SpinRAM is implemented as a coincident-current architecture. An example of the physical layout of a SpinRAM array is shown in the plan view of FIG. 1. The dimensions shown are not to scale. The memory cells include portions of the GMR sense lines 102. The cells are thus in series, though they are not necessarily structurally distinct entities in the GMR film. That is, the GMR film portions of the cells may be part of one continuous structure. In the depicted implementation, the physical locations of the cells—the active parts of the GMR line—are determined by the portions of the GMR film that coincide with the overlay of the straight word lines 104 and serpentine digit lines 106 where these drive lines are co-linear. The co-linearity of the drive lines ensures that the drive fields at the cell location are co-linear.

This design choice—co-linear word and digit lines at the storage location—was implemented to improve cell endurance. That is, there is a cumulative disturb mechanism—magnetization creep—that limits endurance in cell configurations based on architectures with a geometry in which easy-axis and hard-axis drive fields act concurrently. It can cause a film to become demagnetized and lose its information content. This form of disturb, which is distinct from that caused by demagnetizing fields, generally arises for perpendicular drive lines. The problem is avoided, or at least mitigated, with co-linear word and digit lines at the memory cell. This design choice also allows the ends of the keepers 108 to be positioned closely to or in contact with the GMR film, which improves flux closure. Each keeper is constructed from one or more magnetic materials used to help close the flux of the corresponding cell. Magnetization creep is described in *Magnetization Creep in Nickel-Iron Films via the Lever Mechanism*, A. L. Olson and E. J. Torok, J. Appl. Phys. 37, 1297 (1966), and *Magnetization Creep of Cross-Tie Walls*, E. J. Torok et al., J. Appl. Phys. 40, 1222 (1969), the entire disclosures of both of which are incorporated herein by reference for all purposes.

The bit value of each cell is stored in the hard layer of the GMR film (a higher coercivity layer that switches at relatively higher field strengths; e.g. cobalt) as a magnetization direction of the cell. The soft layer (a lower coercivity layer that switches at relatively lower field strengths; e.g. permalloy) is used for readout. See further discussion of the operation below.

The size of the cell in the example array of FIG. 1 is $8F^2$, where F is the feature size. Cell size can be reduced to $4F^2$, the theoretical limit for a single-bit cell in a crosspoint memory, by fabricating alternating digit lines in two separate deposition and patterning steps and introducing additional GMR lines in between the GMR lines in the layout of FIG. 1. In such a design, the two sets of serpentine digit lines are insulated from, and partly overlap, each other. In the depicted implementation, there is no GMR film under the overlap of the digit lines, so no memory cell that could be affected by the field they produce. A simplified schematic of such a $4F^2$ structure is shown in FIG. 2.

Figure 2:
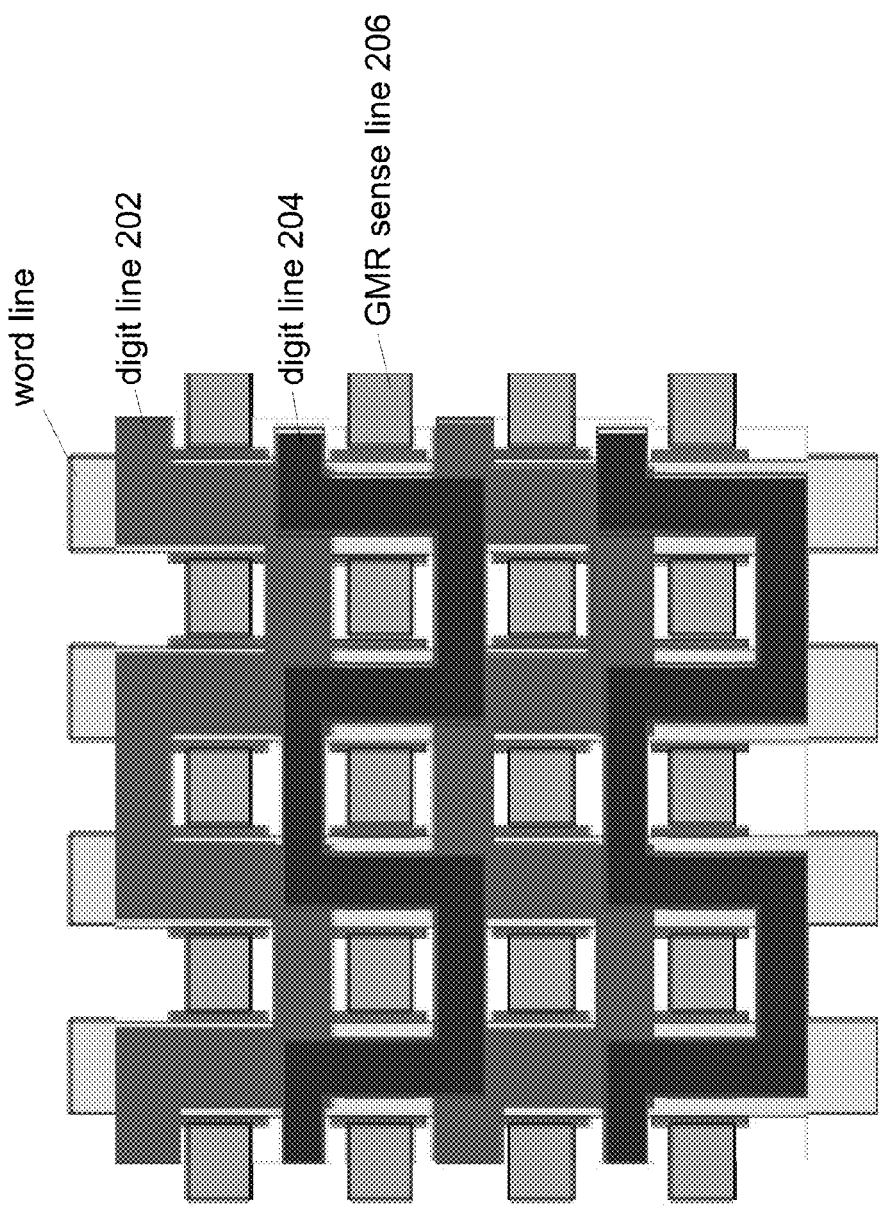
FIG. 2 shows a simplified representation of the layout of another SpinRAM array.

FIG. 2 shows a $4F^2$ cell structure with two separately deposited and patterned sets of serpentine digit lines 202 and 204. The two sets of digit lines are insulated from—and partly overlap—each other. As shown, GMR sense line 206 does not coincide with the overlap of sense lines 202 and 204, so no memory cell are affected by the field they produce. The keeper layers are not shown. Again, the dimensions shown are not to scale.

Yet denser structures can be realized by making cells containing more than one bit. We have fabricated dibit SpinRAM cells by deposition of additional layers in the GMR films. This is a natural extension of the single-bit cell structure, in that GMR films are already 3D constructs. We also have designs for a quadbit structure, which will result in an effective $1F^2$ area per bit.

It takes eight masks to produce the $8F^2$ SpinRAM structure and, if CMOS support circuitry is used, an additional two masking layers to connect it to this circuitry. There are two additional masking steps in going from $8F^2$ to $4F^2$; one additional step from 1 bit per cell to dibit; and three additional steps from dibit to quadbit. Additional information and examples of multibit cells are provided in U.S. Pat. No. 6,594,175 entitled High Density Giant Magnetoresistive Memory Cell issued Jul. 15, 2003, the entire disclosure of which is incorporated herein by reference for all purposes.

Functional components of a SpinRAM memory cell are based on structured magnetic films. A generic feature of a SpinRAM array is that it is made entirely of metals and insulators—no semiconductors. This enables unique SpinRAM capabilities. For example, it can be fabricated on top of an underlying semiconductor IC such as, for example, a CMOS processor. It also enables fabrication of 3D monolithic memories by incorporating replicated 2D arrays into a vertically integrated process in the same production line as the 2D structures. The combination of scalable SpinRAM with 3D capability enables a nonvolatile memory with a density greater than that of hard disk. And because of its all-metal construction, SpinRAM is inherently radiation hard.

SpinRAM operation involves a dynamic role for both the hard layer(s) and the soft layer(s) of the multilayer thin-film structure. The bit value is stored as a magnetization direction in the hard layer which may be constructed from, for example, cobalt. A write operation is achieved by coincident half-select currents in word and digit lines that combine into the full-select current required to impress a specific magnetization on the memory cell where the two lines coincide.

The soft layer (which may be constructed from, for example, permalloy) is used to effect a read operation by applying a current pulse that switches the soft layer of all cells in the selected word line. The resistance of the GMR element is relatively low for parallel orientations of the magnetization directions in the soft and hard layers, and relatively high for antiparallel orientations. This difference in resistance is used to determine the direction of the hard-layer magnetization, and therefore the bit value of the cell. Several methods may be used. The following methods are simply provided as examples.

One method is to apply a full-select bipolar word-current pulse. The cell to be read is selected by the sense line that intersects the word line at this cell. In the nondestructive-readout variant, a sample-and-hold circuit stores the sense signal for one magnetization orientation of the soft layer; this signal is then compared to that for the opposite soft-layer magnetization. The comparison yields the orientation of the hard layer. In a destructive-readout variant, the sense line is connected to the input of an amplifier with autonull capability. The amplifier is then autonulled (i.e., an automatic bias current causes the amplifier output to be adjusted to zero during the time the sense line is connected). The data bit is next written to '0' using the write-current circuit. If the bit value was already '0', no change in amplifier output occurs and a '0' is stored in the output latch. If the bit value was a '1', the state of the sense line changes, the amplifier produces a nonzero output, and a '1' is stored in the output latch. The original datum is then rewritten from value stored by the latch.

An alternative method is to store one bit in two cells located on neighboring sense lines, configured so that the soft and hard layers are parallel in one cell and antiparallel in the other. A differential amplifier will see a signed signal that will establish the magnetization of the hard layer. This is a nondestructive readout and is expected to be faster than using a bipolar pulse, but it halves the storage density.

A readout-related issue in this architecture is that the number of cells that can be placed on a line is limited by noise and the GMR value. The signal-to-noise ratio of the sense-line output in this architecture is proportional to GMR and inversely proportional to the square root of both the bandwidth and the number of cells/line. It therefore affects both the read speed and memory capacity. GMR values in conventional films are too low to meet the capacity requirements of commercial memories. As mentioned above, we have developed a GMR film structure that raises the useful GMR value so as to enable high-capacity memories. Examples of this type of structure are described in U.S. Pat. No. 8,619,467 incorporated herein by reference above.

Figure 3:
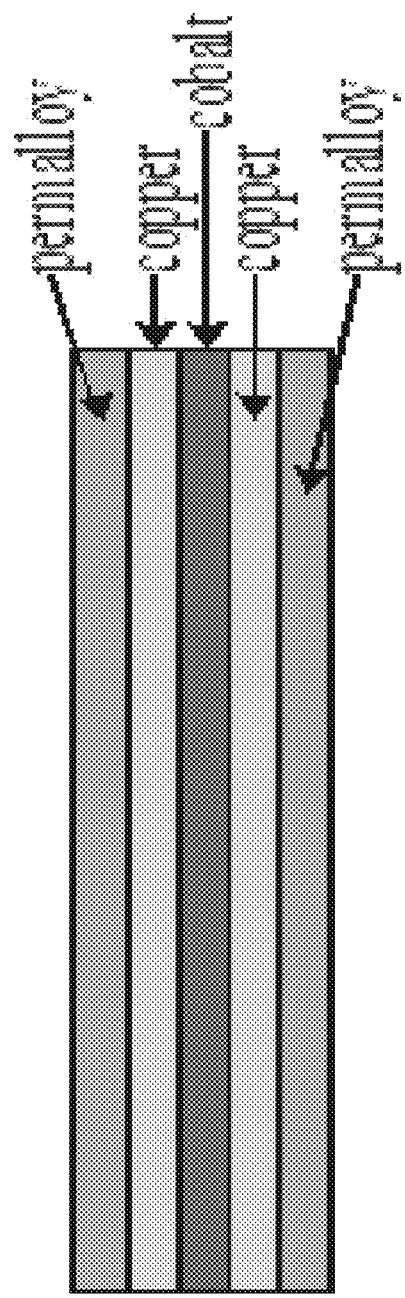
FIG. 3 shows an example of a structure of a GMR film for use with SpinRAM arrays.

According to some implementations, the GMR films in the SpinRAM cells are double pseudo spin valve structures with one or more periods including layers permalloy/copper/cobalt/copper/permalloy as shown in FIG. 3. According to a particular implementation, the permalloy is dusted with cobalt to inhibit diffusion, and the cobalt contains 10% iron to minimize magnetostriction. In a bulk (unpatterned) film the cobalt switches at a field of about 10 Oe; the permalloy, at about 2 Oe.

SpinRAM cells with partially-closed flux (e.g., see FIG. 4) have been fabricated and tested at 5 µm, 500 nm, 100 nm feature sizes. The metallic keeper 402 is separated from the GMR film 404 in this design by the thin insulation layer labeled "insulation 1" in FIG. 4 in order not to short the signal in the GMR film. The gap created by insulation 1 results in a magnetic discontinuity in the magnetic circuit between the keeper and the storage element (the GMR film).

Figure 4:
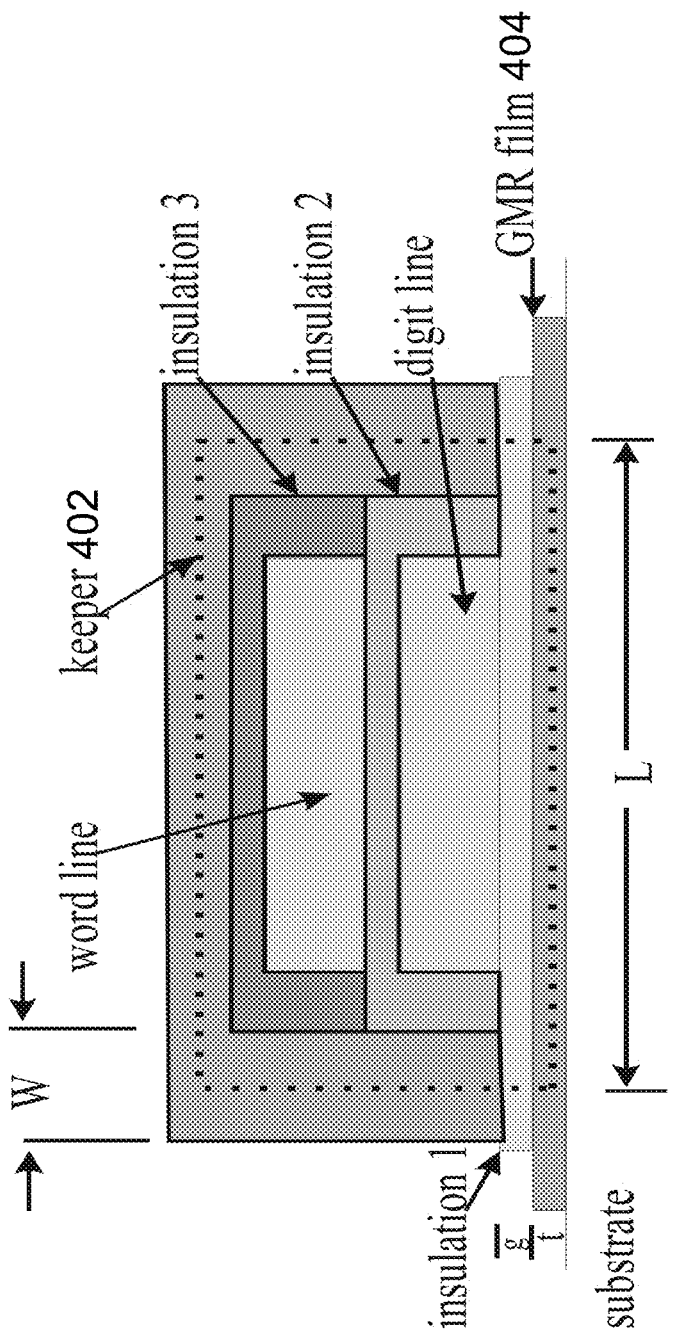
FIG. 4 shows a cross-section of a SpinRAM memory cell.

Test results showed that, though the cell shown in FIG. 4 could be successfully operated, the drive currents exceeded twice those expected of a cell with closed flux. Analysis of the results showed that the source of the problem was the gap, which causes significantly increased demagnetizing fields $H_d$ as feature size approaches the gap size. This presents an obstacle to scalability unless gap thickness is correspondingly reduced. It was found that, below a feature size of about 90 nm, the gap would have to be made so thin as to short the signal in the GMR film. Increasing $H_d$, in turn, increases drive currents and error rates.

Alternative approaches to magnetic RAM (e.g., magnetic tunneling junction (MTJ) MRAM) have large and increasing drive currents and increasing error rates with decreasing feature size F. Both of these factors indicate the presence of large $H_d$ in MTJ MRAMs; likely caused by gaps in their cell designs.

Figure 5:
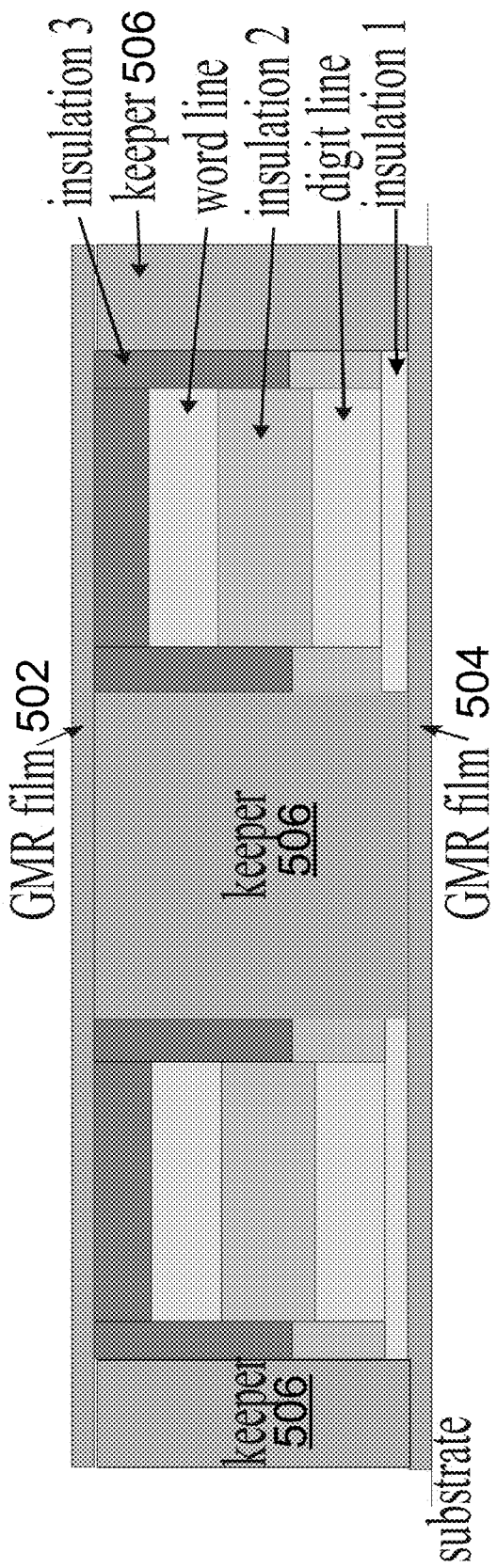
FIG. 5 shows a cross-section of another SpinRAM memory cell.

An example of an implementation of SpinRAM cells with fully-closed flux is shown in FIG. 5. In the depicted implementation, each of the two adjacent cells includes sections of two GMR films 502 and 504 (i.e., "paired" GMR films) as opposed to the single GMR film 404 (i.e., an "unpaired" GMR film) shown in FIG. 4. The cell cross sections in FIG. 5 are perpendicular to the plane of the array in FIG. 1 with the horizontal direction of the GMR films 502 and 504 corresponding to the horizontal direction of the GMR film strips 102 in the plane of FIG. 1. The drive line currents are perpendicular to the plane of the cell cross sections (i.e., into and out of the page). These currents produce either clockwise or counterclockwise-circulating magnetic fields around the drive lines parallel to the plane of the cross sections. These magnetic fields are contained by the fully-closed flux structures formed by GMR films 502 and 504, and non-conductive magnetic keeper elements 506.

We determined that, in order to avoid large demagnetizing fields, (1) each cell preferably has fully-closed flux (e.g., as shown in FIG. 5); (2) the GMR films preferably have paired magnetic layers (e.g., the two permalloy layers in FIG. 3); and (3) the cell preferably has paired GMR films (e.g., films 502 and 504 of FIG. 5). Provided these design features are met, SpinRAM drive currents and power consumption are projected to decrease with feature size into deep nanoscale, with error rates remaining stable. In some implementations, the cells depicted in FIG. 5 may incorporate ferromagnetically coupled GMR superlattices as operating elements in the cell structure. In addition, such cells may be implemented without semiconductor elements, thereby enabling 3D monolithic capability.

That is, implementing a SpinRAM cell without semiconductors obviates a major obstacle that characterizes the fabrication of 3D semiconductor circuits. It allows SpinRAM structures to be stacked vertically and electrically connected, as needed, by interconnecting layers. The vertical disposition of SpinRAM structures modifies the physical deployment of the system building blocks without affecting the logical and electronic functionality of the system.

Vertical manufacturing technology enables building non-volatile memory structures with the all-metal support electronics—sense amplifiers, decode circuitry, bit and word drivers, data buffers—physically deployed above, beneath, or alongside the memory cell array. This significantly reduces the overall physical area of the memory component. Examples of all-metal support electronics are described in U.S. Pat. No. 5,929,636 entitled All-Metal, Giant Magnetoresistive, Solid-State Component issued Jul. 27, 1999, the entire disclosure of which is incorporated herein by reference.

Figure 6:
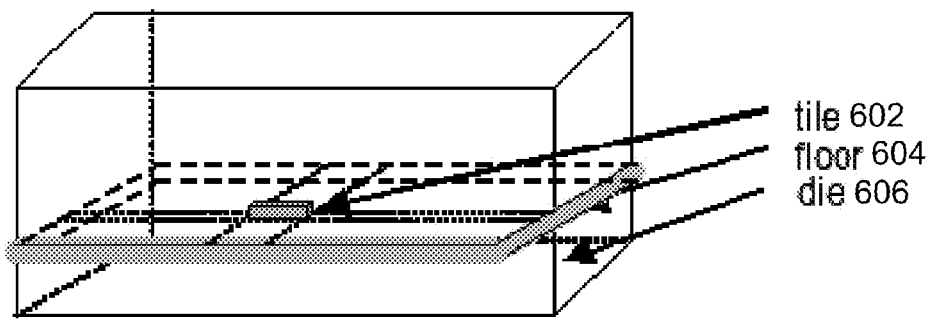
FIG. 6 shows the physical organization of 3D SpinRAM array.

Vertical manufacturing capability creates the potential for 3D SpinRAM to exceed the density of mechanical-magnetic storage (hard disk drives). In addition, SpinRAM consumes little power because only accessed lines and associated support electronics are powered, so that, unlike hard-disk storage in data centers, power density remains substantially constant with increasing capacity. Furthermore, a 3D structure may significantly reduce the cost of electronic components as the cost of an IC is more nearly proportional to its area rather than its volume. A simplified schematic of such a structure is shown in FIG. 6.

Figure 7:
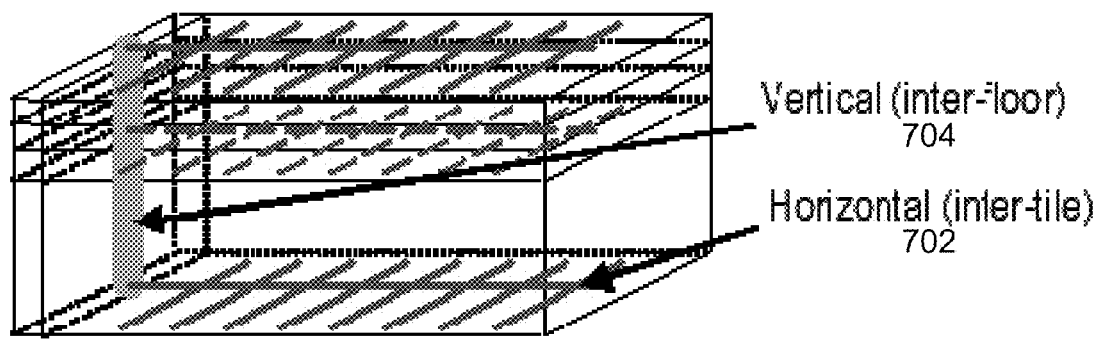
FIG. 7 illustrates chip-scale interconnectivity for a 3D SpinRAM array.

Physically, the development of such a 3D structure may involve a highly modular construction. The basic module, referred to herein as a "tile" 602, is a self-contained memory block, i.e., a memory cell array and associated circuitry. Multiple tiles are physically organized into a 2D construction referred to herein as a "floor" 604. Multiple floors are stacked to form the 3D "die" 606. Each tile 602 has a three-level structure: 1) the memory cell array; 2) connections to support electronics (address logic, sense amplifiers) at the periphery; and 3) connection stratum (for intra-die connectivity). The advantage of such a three-level tile structure is that the overhead and connections do not increase the footprint appreciably (i.e., nearly 100% cell-array efficiency). A simplified schematic of intra-die interconnectivity is shown in FIG. 7.

Logically, the 3D structure appears linear as the tiles are contiguously connected in a linear address space. Floors are transparent to the selection logic. Intra-tile and inter-tile (horizontal) connectivity is achieved via a dedicated connection stratum 702. Inter-floor (vertical) connectivity 704 is achieved via a dedicated area at the floor edges which increases floor area by about 2%-5%. The tiles are connected to an internal bus. The number of data and control lines does not increase with component capacity. The number of address lines increases slightly. Such a 3D structure differs fundamentally from the packaging of multiple wafers in a single module. Additional information and examples are provided in U.S. Pat. No. 6,992,919 incorporated herein by reference above.

To analyze the extent of flux closure needed for scalability into deep subnanoscale, we implemented a partially-closed flux cell design with a gap as shown in and described above with reference to FIG. 4. We fabricated and tested this design at feature sizes F ranging from 5 µm down to 100 nm. We found that drive currents and error rates increased with decreasing F, and that drive currents at fixed cell-feature size depend on gap thickness.

We simulated performance of the cell design of FIG. 4 into nanoscale. We found that write currents increase rapidly as feature size shrinks below a micron. We believe this to be due to the sharp rise in the demagnetizing field $H_d$ at nanoscale dimensions. We also found that to reduce $H_d$ to an acceptable level, gap thickness has to be decreased correspondingly so as not to exceed strip width. At feature size below about 90 nm, the gap would have to be made so thin as to short the signal in the GMR film. The requirement that the gap layer must remain thick enough to be reliably short free prevents miniaturization of the cell design of FIG. 4 into deep nanoscale.

To analyze the optimal GMR film structure, we analyzed restrictions on the structure of GMR films needed to minimize demagnetizing fields. Our theoretical results showed that narrow GMR film strips with either unpaired magnetic layers or paired magnetic layers of wide separation have large demagnetizing fields $H_d$. At microscale, $H_d$ is significantly lower for paired magnetic layers than it is for a stand-alone film strip, indicating that the large demagnetizing fields in unpaired films can be well controlled at this feature size by pairing the magnetic layers, provided the spacer thickness between them is kept small. This pairing of magnetic layers was incorporated into the GMR film and is illustrated in FIG. 3 and has been used in our SpinRAM cell designs. We also fabricated GMR films at microscale with and without the paired layers. We found that $H_d$ in films with paired layers was more than an order of magnitude lower than in the unpaired-layer films, confirming the theoretical results.

We also analyzed demagnetizing fields of GMR films with paired layers at nanoscale feature sizes. We found that the demagnetizing field, even of paired magnetic layers, increases greatly from microscale to nanoscale. We found that we can compensate for this increase by using paired GMR films and magnetic keepers to form a closed-flux memory cell structure as shown, for example, in FIG. 5.

We also analyzed the restrictions on the choices of geometric cell parameters imposed by the requirements of stability of the magnetized state and maintaining low switching fields. We found that the aspect ratio of the cell (i.e., length-to-width) was best kept between 1.2 and 1. We also found that the aspect ratio, the separation of the magnetic layers, and the layer thicknesses should not be varied independently in that changes in one parameter typically required compensation by changes in the other two in order to maintain both stability and low switching field.

Figure 8:
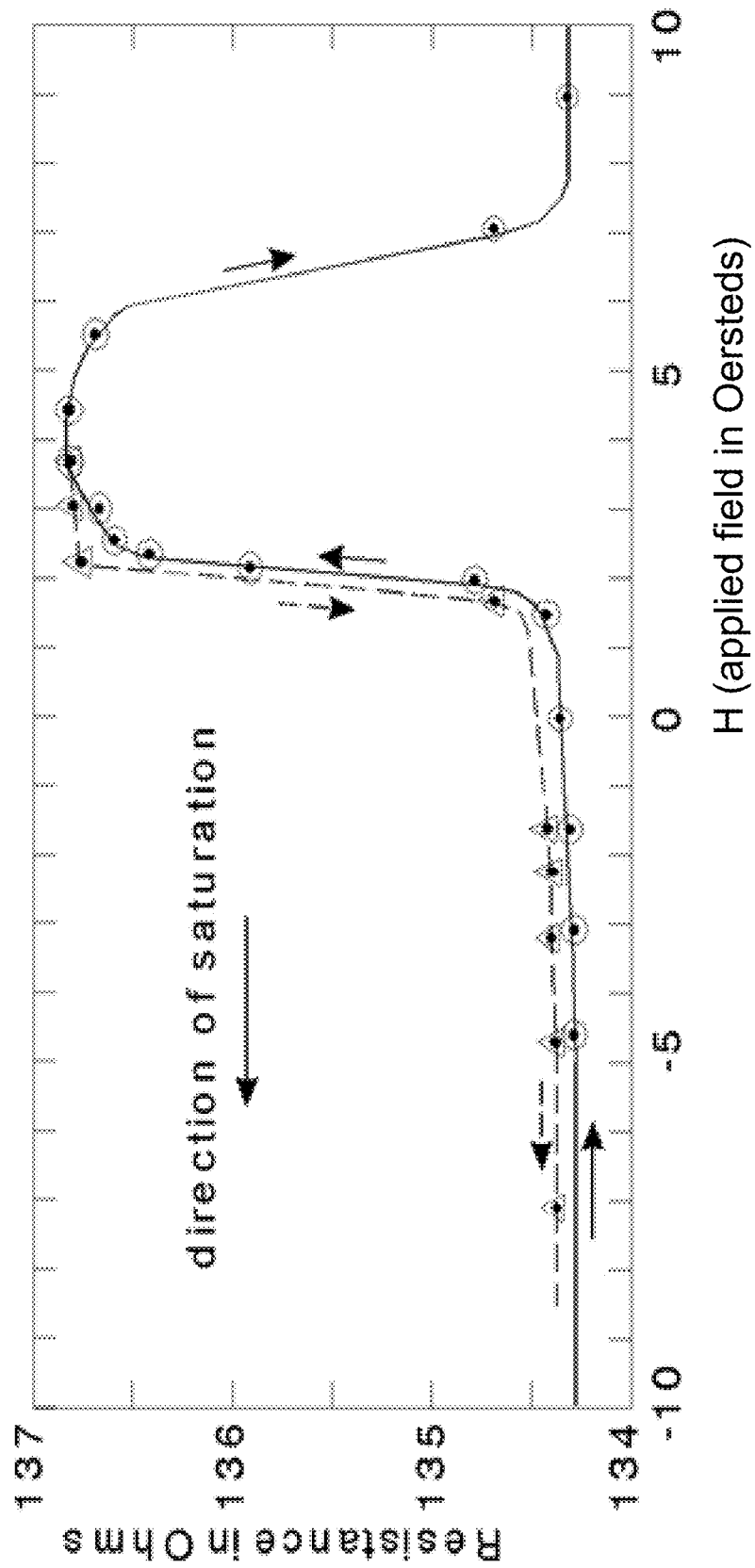
FIG. 8 shows the R-H curve of a bulk GMR material.

To determine the relative orientation of patterned GMR films and the drive field required for a viable SpinRAM cell, we fabricated a set of GMR films with paired layers of composition (the symbol "Pe" is used for permalloy)/Pe 6 nm/Cu 2 nm/Co 6 nm/Cu 2 nm/Pe 4 nm/. The R-H curve of a bulk film (i.e., not cut into strips) is shown in FIG. 8. The depicted curve is the desired behavior for GMR film strips patterned to nanoscale.

In the four configurations of patterned GMR films discussed below, the thin strips are cut perpendicular to the easy axis defined by the direction of the magnetic field present during film deposition (EAM). We used e-beam lithography at the Cornell Nanotechnology Facility to pattern films with paired layers into strips of widths ranging from 5 µm down to 100 nm. The results varied depending on whether the GMR films in the cell are paired or unpaired, on feature size, and on the relative orientations of the GMR strip and the drive fields.

Measurements on an unpaired GMR film showed no GMR effect for either of the two configurations of the in-plane drive field relative to the EAM (i.e., the easy axis defined by the magnetic field impressed during deposition). The switching field for a 600 nm-wide strip with the applied field H perpendicular to the EAM (see the R-H curve of FIG. 9) was an order of magnitude higher than that for a wide strip. The switching field for a 140 nm-wide strip with the drive field parallel to the EAM (see the R-H curve of FIG. 10) was two orders of magnitude higher than that for a wide strip.

Figure 9:
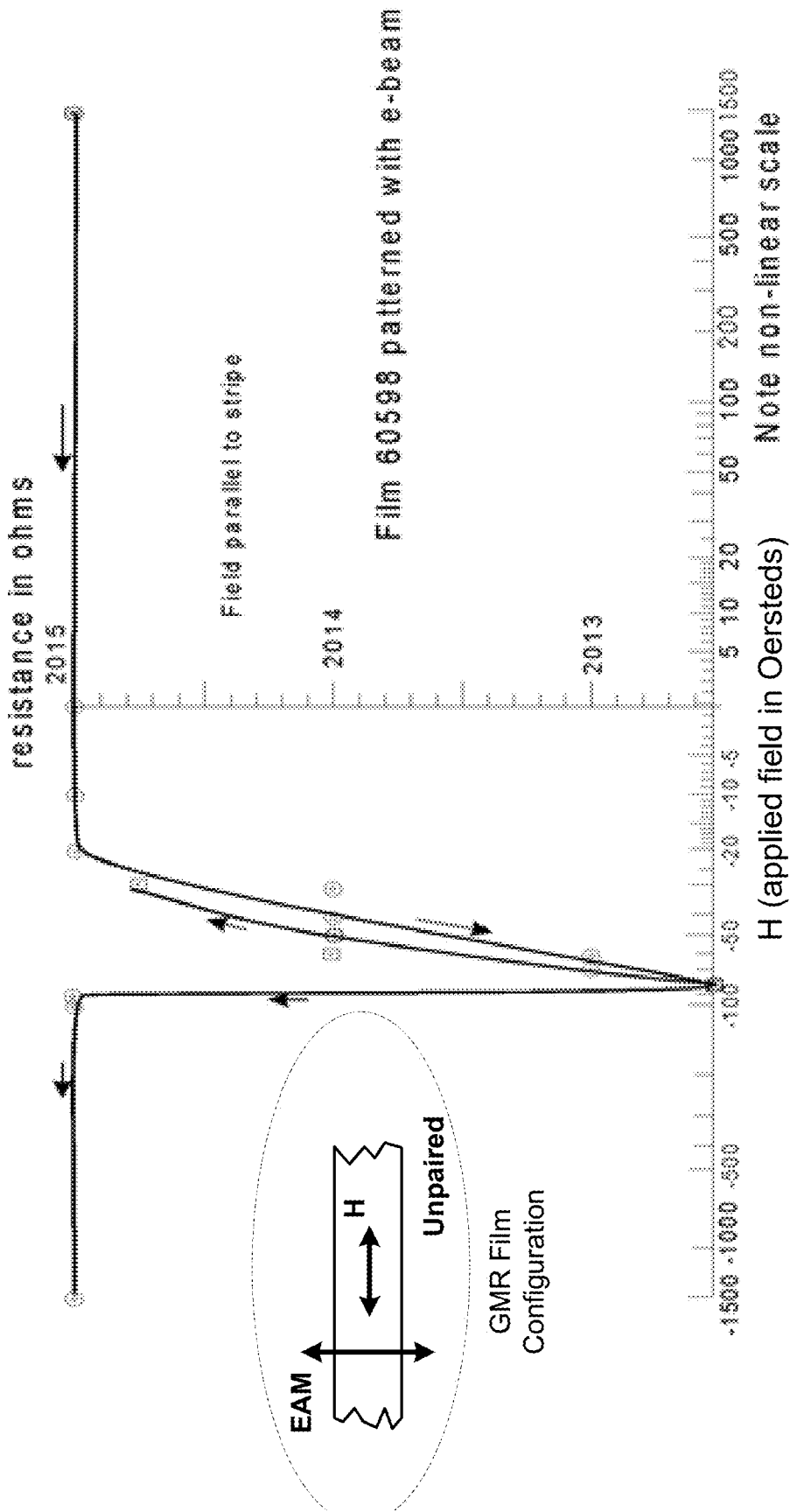
FIGS. 9-12 show the R-H curves for patterned GMR films having different characteristics.
Figure 10:
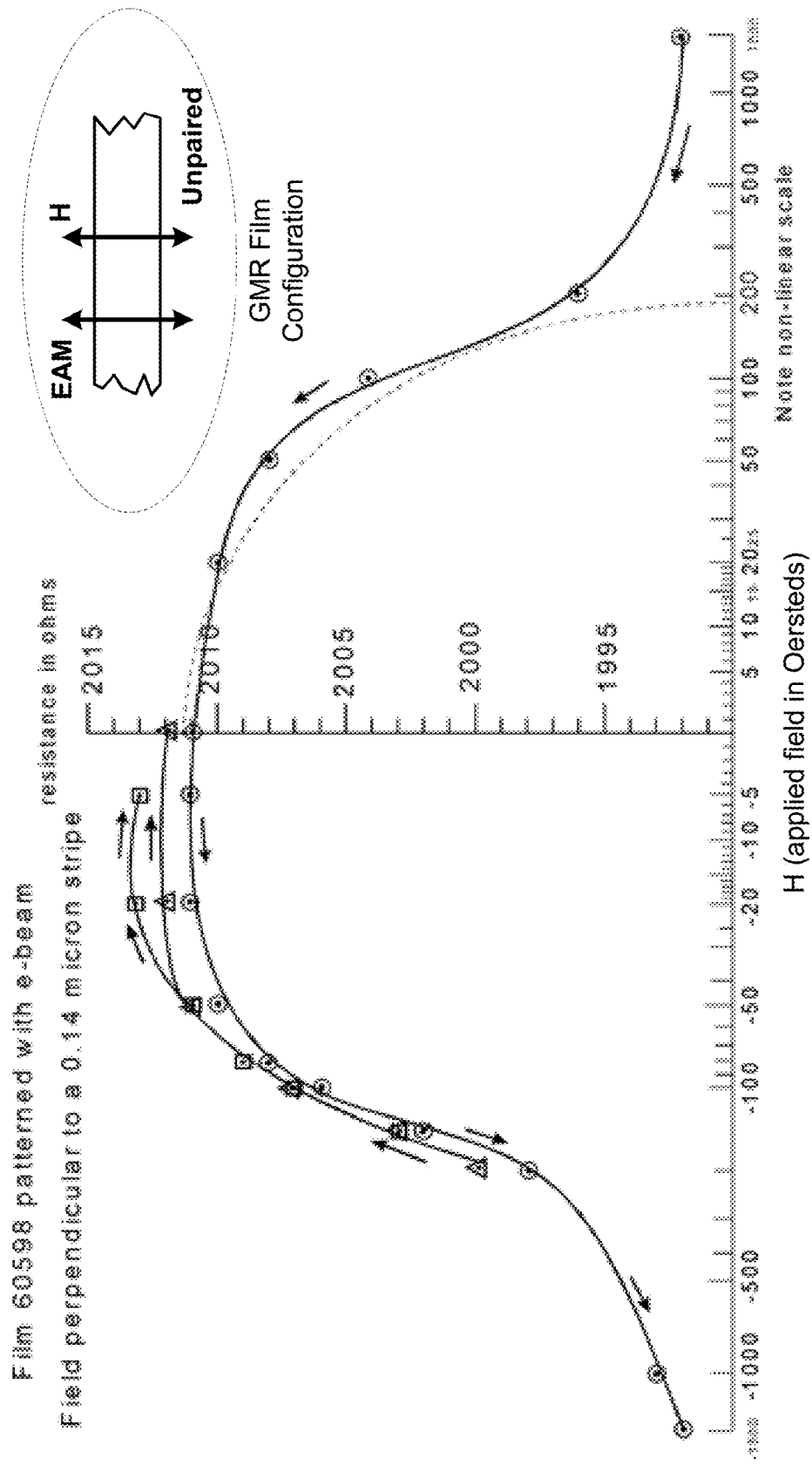

In both FIGS. 9 and 10, the EAM is perpendicular to the strip, but the shape-anisotropy easy axis is in the direction of the strip. Theoretical analysis indicates that narrow strips of either unpaired films or paired films of very wide separation have large demagnetizing fields, and that permalloy and cobalt switch together rather than separately because the differences in anisotropy and coercivity of permalloy and cobalt are overwhelmed by the shape anisotropy and stray field of the strips in an unpaired GMR film. Each of the R-H curve loops has the shape and low resistance change typical of anisotropic magnetoresistance (AMR) rather than that of GMR.

Figure 11:
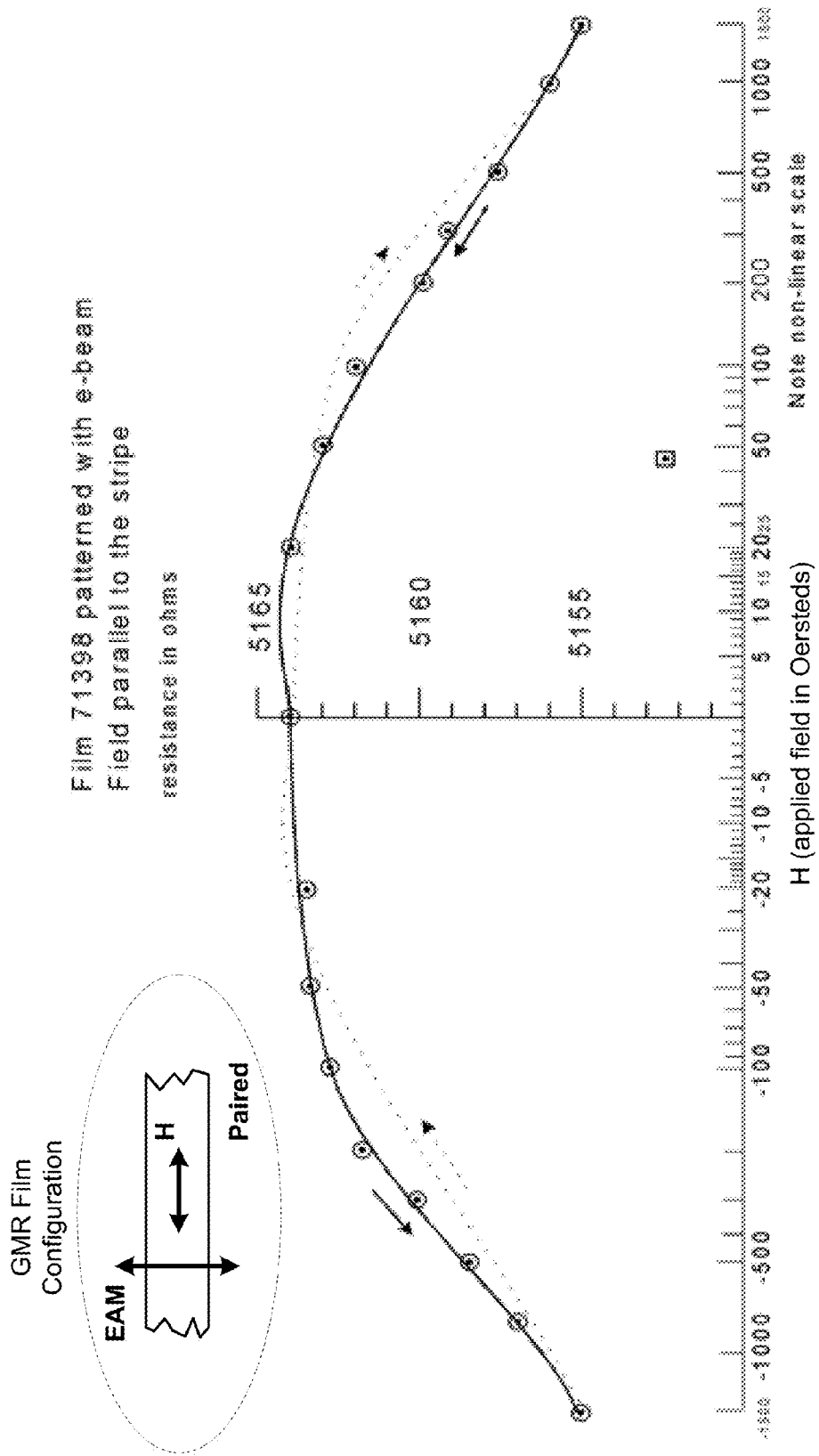
Figure 12:
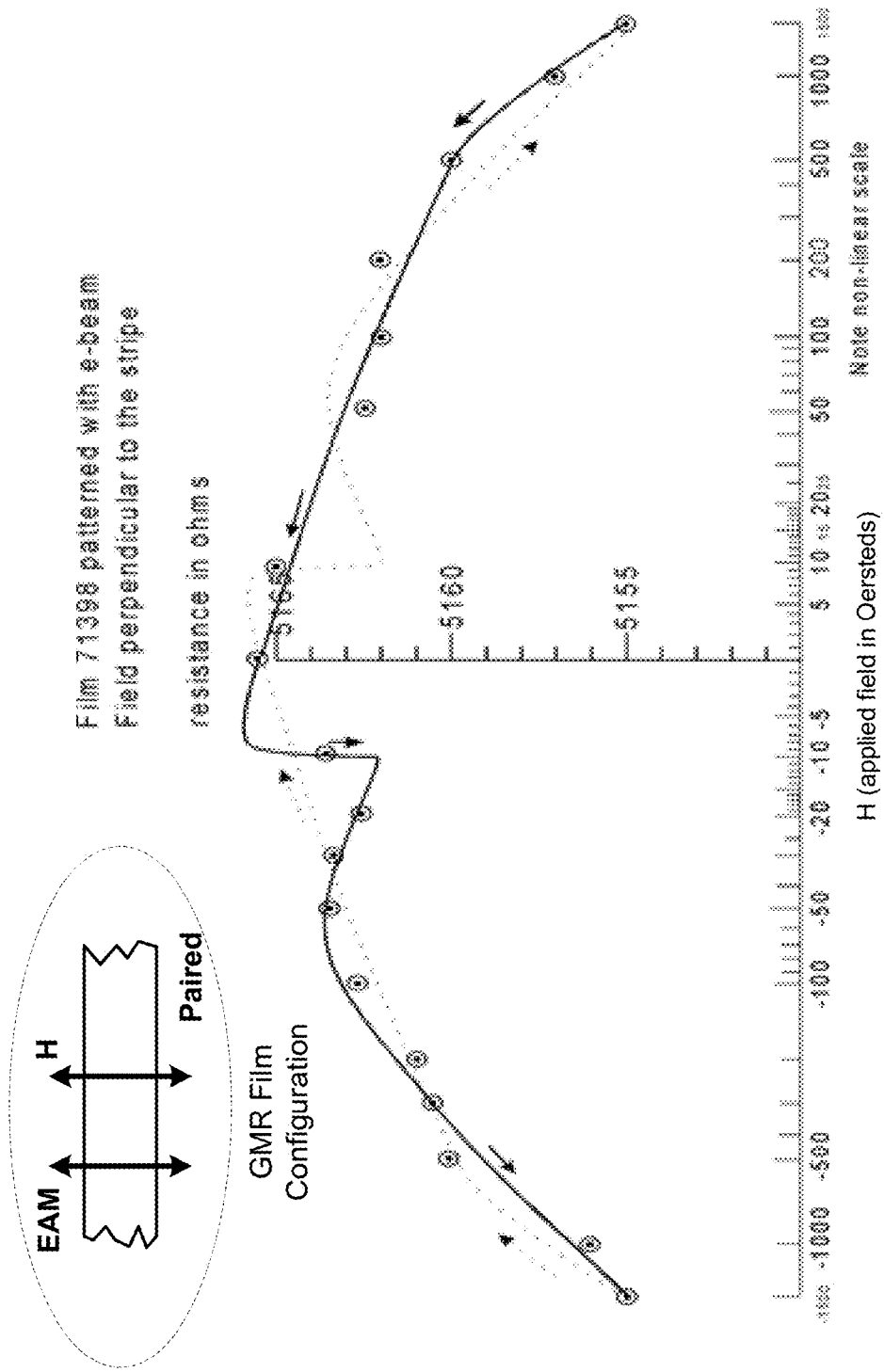

For paired films at feature sizes corresponding to those of the unpaired films, there is still no GMR effect for the configuration with the drive field in the direction along the strip (see the R-H curve of FIG. 11). By contrast, the configuration with the in-plane drive field perpendicular to the GMR strip (see the R-H curve of FIG. 12) does show the GMR effect, and the switch takes place at a value on the order of, though larger than, that of the wide strip. The use of paired GMR films thus substantially cancels the demagnetizing field and greatly lowers the switching threshold of nanoscale memory elements. Note that in this configuration, the GMR strip is parallel and co-linear with the word line rather than perpendicular as shown in FIGS. 1 and 2.

We redesigned the memory cell so as to eliminate the gap entirely resulting in a cell design with a fully-closed flux as shown in FIG. 5. We simulated performance of this cell design down to deep nanoscale. We found that drive currents decrease and error rates remain low with decreasing feature size.

The orientation of the GMR strip (co-linear with the word line) allows for a similar increase in density as described above with reference to the array of FIG. 2 without the need for adding GMR strips relative to the array shown in FIG. 1. This is because the overlapping, serpentine digit lines now intersect with the vertical GMR strips at more locations to create memory cells.

When the GMR strip is co-linear with the word line, the resulting area of the memory element (overlap of the two drive lines and the GMR line) is now 1F×3F, i.e., three squares in a vertical line with one another; where a square can be thought of as the area of the intersection of a horizontal and vertical line. This aspect ratio may be undesirably far from unity. Therefore, according to some implementations, configurations are contemplated that reduce this area closer to 1F×1F. According to one such implementation, the parts of the GMR line that correspond to the two outer squares in the overlap region of the GMR line are replaced by non-magnetic conductors. This reduces the area of the memory cell to 1F×1F with the non-magnetic conductor portions of the GMR line being between adjacent memory cells that share that line. It also avoids having two adjacent digit lines interacting with the same portion of the GMR line (e.g., where the digit lines overlap as shown in FIG. 2).

The results represented by the R-H curves of FIGS. 9-12 for patterned films are summarized in Table 1. Note that the low value of the switching field for the observed GMR is obtained without the use of keepers, an important element of the memory cell that are expected to lower the switching field further. "EAM" is the easy axis defined by the magnetic field impressed during deposition. "Paired" and "Unpaired" refers to the GMR films (rather than the layers of the GMR films).

As described herein, SpinRAM feature size can be decreased into deep nanoscale, provided the cell geometry and parameters are designed appropriately. These may include, for example, that (1) the GMR films have paired magnetic layers (e.g., as shown in FIG. 3); (2) the GMR films in the memory cell are paired (e.g., as shown in FIG. 5); (3) magnetic flux is closed in the memory cell (e.g., as in the cell of FIG. 5); (4) the easy axis defined by the direction of the magnetic field present during film deposition (EAM) is perpendicular to the strip length; and/or (5) the cell aspect ratio is approximately 1. In addition, the design with fully-closed flux has decisive advantages in power consumption, error rates, and memory density over designs with incomplete flux closure.

Figure 13:
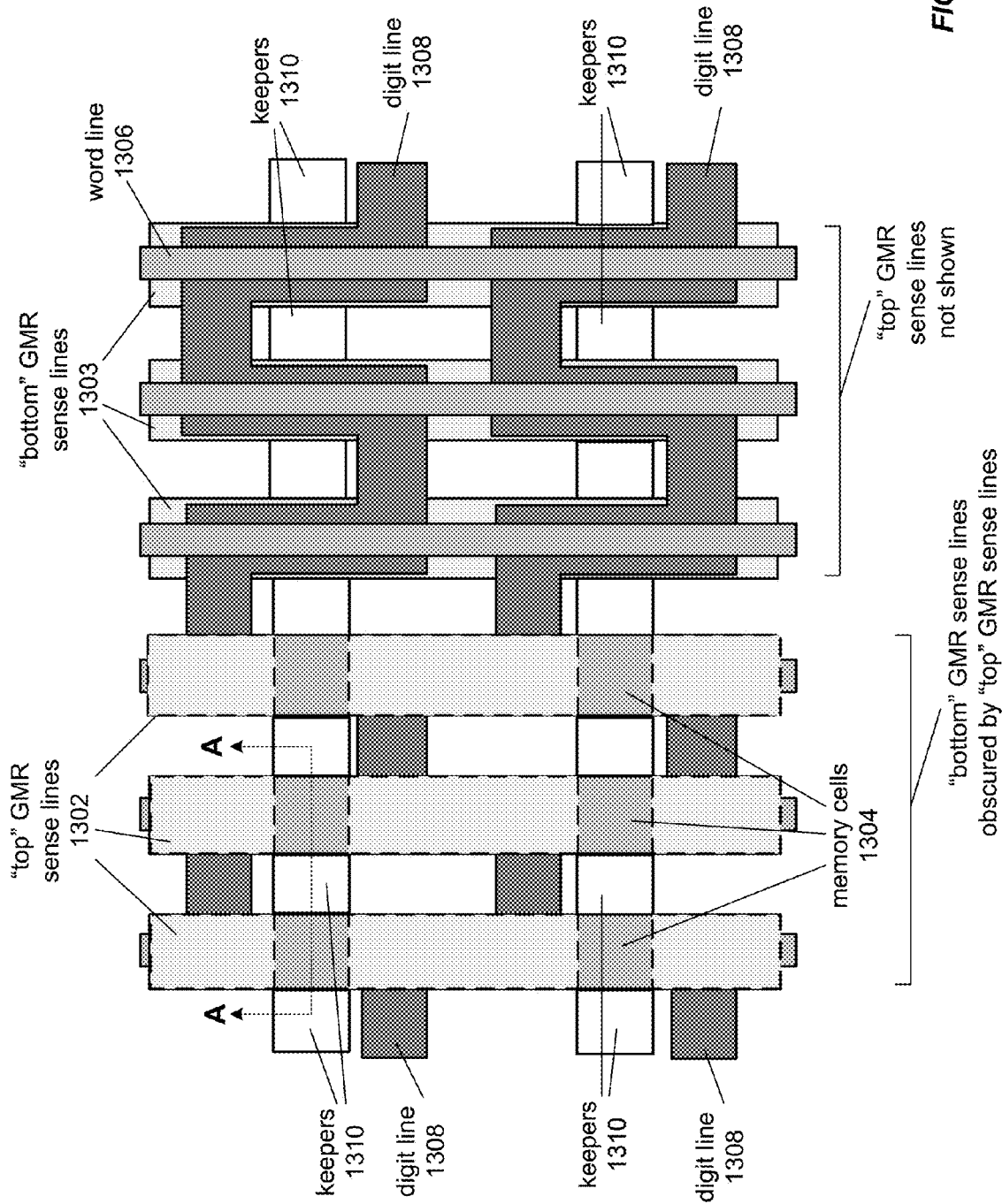
FIG. 13 shows a simplified representation of the layout of another SpinRAM array.
Figure 14:
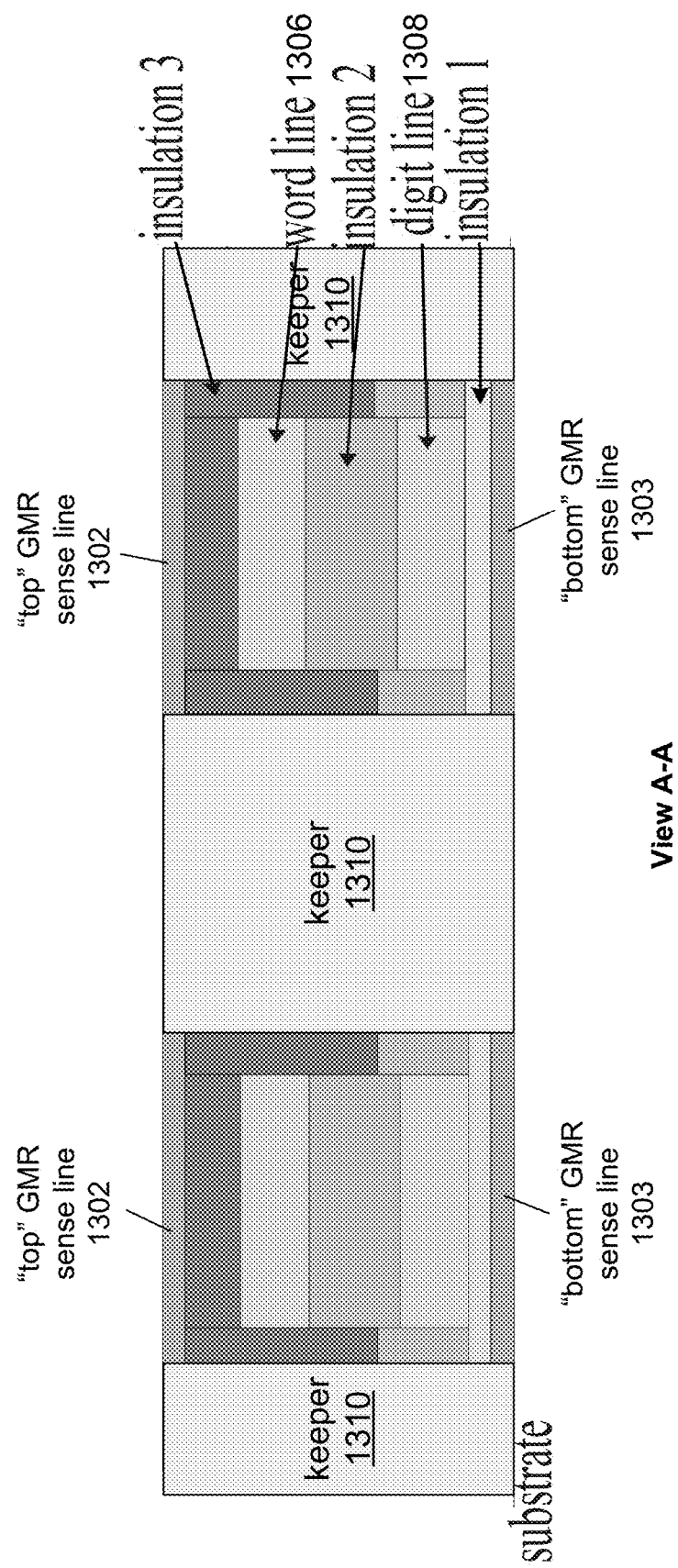
FIG. 14 shows a cross-section of another SpinRAM memory cell.

FIG. 13 shows a plan view of a portion of a SpinRAM array in which the GMR films have paired magnetic layers, the GMR films at each memory cell are paired, each memory cell has a fully-closed flux structure, the EAM is perpendicular to the longitudinal axis of the GMR strips, and the GMR strips are co-linear with the word lines. FIG. 14 shows a cross-section of two adjacent memory cells represented by cross-section line A-A in FIG. 13.

The left-hand half of the array includes the "top" GMR strips (i.e., sense lines) 1302 that obscure the corresponding "bottom" GMR strips 1303 from the depicted perspective. The right-hand half of the array is shown without the "top" GMR strips 1302 so that the underlying structures (i.e., word lines 1306, digit lines 1308, and "bottom" GMR strips 1303) may be more clearly illustrated. Insulators are not shown in FIG. 13 for clarity. It should be understood that the terms "top" and "bottom" are relative terms used for illustrative purposes and may or may not correspond to how those terms relate to a local gravitational field. It should also be noted that the depicted structures are not shown to scale.

Each memory cell 1304 is located at the coincidence of a top GMR sense line 1302, a bottom GMR sense line 1303, a word line 1306, and a digit line 1308. In contrast with the array of FIG. 1, GMR sense lines 1302 and 1303 are co-linear with word lines 1306. That is, the longitudinal axes of GMR sense lines 1302 and 1303 are perpendicular to the view of FIG. 14 (i.e., extending into and out of the page). Similar to the array of FIG. 1, digit lines 1308 are serpentine structures so that the drive fields generated by currents in digit lines 1308 and word lines 1306 are aligned with each other along the same axis; in this case perpendicular to the longitudinal axes of GMR sense lines 1302 and 1303. And because the EAM of paired GMR sense lines 1302 and 1303 is also perpendicular to the longitudinal axes of these sense lines, the cell configuration corresponds to the configuration discussed above with reference to FIG. 12. Non-conductive magnetic keepers 1310, along with top and bottom GMR sense lines 1302 and 1303 form a fully-closed flux structure at each memory cell 1304.

Because keepers 1310 are in parallel with memory cells 1304, keepers 1310 are constructed (at least in part) from a non-conductive magnetic material to avoid providing a shorting path for the sense current in GMR sense lines 1302 and 1303. According to various implementations, keepers 1310 may be constructed using, for example, a magnetically soft ferrite. "Soft" in this context refers to material having high permeability & low coercivity. In some cases, the keepers may be constructed entirely from such a material. In other cases, the keepers may be constructed using more than one type of material as long as shorting of GMR sense lines 1302 and 1303 is avoided.

According to a particular implementation, GMR sense lines 1302 and 1303 are constructed with alternating sections of GMR film (at each memory cell) and non-magnetic conductors (between memory cells) as represented by the dashed lines on GMR sense lines 1302. As will be appreciated, these intervening non-magnetic segments of the GMR sense lines allow for greater density in that the digit lines may be moved closer together or even overlap as discussed above with reference to FIG. 2. They also allow for memory cell aspect ratios in the more desirable range of approximately 1 to 1.2.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A memory, comprising:
   a plurality of first signal lines;
   a plurality of second signal lines; and
   a plurality of first thin-film structures exhibiting magnetoresistance;
   wherein the first signal lines, the second signal lines, and the first thin-film structures form an array of memory cells, each memory cell comprising:
      a portion of a corresponding one of the first thin-film structures;
      a portion of a corresponding one of the first signal lines coinciding with the portion of the corresponding first thin-film structure and electrically isolated therefrom;
      a portion of a corresponding one of the second signal lines coinciding with the portion of the corresponding first signal line and the portion of the corresponding first thin-film structure, the portion of the corresponding second signal line being electrically isolated from the corresponding first signal line and the corresponding first thin-film structure; and
      one or more keeper elements in direct contact with the portion of the corresponding first thin-film structure such that the portion of the corresponding first thin-film structure and the one or more keeper elements form at least part of a fully-closed-flux structure of the memory cell; and
   wherein, for each memory cell, the portion of the corresponding first thin-film structure has an easy axis of magnetization perpendicular to a longitudinal axis of the portion of the corresponding first thin-film structure, and wherein the first and second signal lines are configured to generate magnetizing fields at each memory cell that are perpendicular to the longitudinal axis of the portion of the corresponding first thin-film structure.

2. The memory of claim 1, further comprising a plurality of second thin-film structures exhibiting magnetoresistance, each memory cell further comprising a portion of a corresponding one of the second thin-film structures, the portion of the corresponding second thin-film structure for each memory cell coinciding with and being electrically isolated from the corresponding first signal line, the corresponding second signal line, and the corresponding first thin-film structure, and wherein, for each memory cell, the portion of the corresponding second thin-film structure forms part of the fully-closed flux structure.

3. The memory of claim 1, wherein the first and second signal lines are configured such that, for each memory cell, a primary direction of current flow in the portion of the corresponding first signal line is parallel to a primary direction of current flow in the portion of the corresponding second signal line.

4. The memory of claim 1, wherein at each memory cell, the portion of the corresponding first thin-film structure and the portions of the corresponding first and second signals lines are co-linear.

5. The memory of claim 4, wherein each of the first thin-film structures includes sections of non-magnetic conductors between adjacent memory cells.

6. The memory of claim 1, wherein the first thin-film structure includes at least one high-coercivity magnetic layer and at least one low-coercivity magnetic layer.

7. The memory of claim 6, wherein the first thin-film structure includes a pair of low-coercivity magnetic layers.

8. The memory of claim 7, wherein the first thin-film structure includes a first permalloy layer, a first copper layer, a cobalt layer, a second copper layer, and a second permalloy layer.

9. The memory of claim 6, wherein the first thin-film structure comprises a ferromagnetically-coupled superlattice having multiple periods of the high and low-coercivity layers.

10. The memory of claim 1, wherein each memory cell is characterized by an aspect ratio of approximately 1 to 1.2.

11. A memory cell comprising:
    a portion of a first thin-film structure;
    a first signal line coinciding with the portion of the first thin-film structure and electrically isolated therefrom;
    a second signal line coinciding with the first signal line and the portion of the first thin-film structure, the second signal line being electrically isolated from the first signal line and the first thin-film structure; and
    one or more keeper elements in direct contact with the portion of the first thin-film structure such that the portion of the first thin-film structure and the one or more keeper elements form at least part of a fully-closed-flux structure of the memory cell; and
    wherein, the portion of the first thin-film structure has an easy axis of magnetization perpendicular to a longitudinal axis of the first thin-film structure, and wherein the first and second signal lines are configured to generate magnetizing fields that are perpendicular to the longitudinal axis of the first thin-film structure.

12. The memory cell of claim 11, further comprising a portion of a second thin-film structure coinciding with and electrically isolated from the first signal line, the second signal line, and the first thin-film structure, wherein the portion of the second thin-film structure forms part of the fully-closed flux structure.

13. The memory cell of claim 11, wherein the first and second signal lines are configured such that a primary direction of current flow in the first signal line at the memory cells is parallel to a primary direction of current flow in the second signal line at the memory cell.

14. The memory cell of claim 11, wherein the portion of the first thin-film structure and the first and second signals lines are co-linear at the memory cell.

15. The memory cell of claim 14, wherein the first thin-film structure includes sections of non-magnetic conductors on either side of the memory cell.

16. The memory cell of claim 11, wherein the portion of the first thin-film structure includes at least one high-coercivity magnetic layer and at least one low-coercivity magnetic layer.

17. The memory cell of claim 16, wherein the portion of the first thin-film structure includes a pair of low-coercivity magnetic layers.

18. The memory cell of claim 17, wherein the portion of the first thin-film structure includes a first permalloy layer, a first copper layer, a cobalt layer, a second copper layer, and a second permalloy layer.

19. The memory cell of claim 16, wherein the portion of the first thin-film structure comprises a ferromagnetically-coupled superlattice having multiple periods of the high and low-coercivity layers.

20. A memory cell comprising:
- a portion of a first thin-film structure exhibiting giant magnetoresistance, the first thin film structure including a high-coercivity magnetic layer and a corresponding pair of low-coercivity magnetic layers;
- a first signal line coinciding with the portion of the first thin-film structure and electrically isolated therefrom;
- a second signal line coinciding with the first signal line and the portion of the first thin-film structure, the second signal line being electrically isolated from the first signal line and the first thin-film structure;
- a portion of a second thin-film structure coinciding with and electrically isolated from the first signal line, the second signal line, and the first thin-film structure, the second thin-film structure exhibiting giant magnetoresistance and including a high-coercivity magnetic layer and a corresponding pair of low-coercivity magnetic layers; and
- one or more keeper elements in direct contact with the portion of the first thin-film structure and the portion of the second thin-film structure such that the portion of the first thin-film structure, the portion of the second thin-film structure, and the one or more keeper elements form a fully-closed-flux structure of the memory cell; and
- wherein, the portion of the first thin-film structure has an easy axis of magnetization perpendicular to a longitudinal axis of the first thin-film structure, the portion of the second thin-film structure has an easy axis of magnetization perpendicular to a longitudinal axis of the second thin-film structure, and wherein the first and second signal lines are configured to generate magnetizing fields that are perpendicular to the longitudinal axes of both the first and second thin-film structures.

* * * * *